(12) United States Patent
He et al.

(10) Patent No.: US 10,839,868 B2
(45) Date of Patent: Nov. 17, 2020

(54) REDUNDANCY AREA REFRESH RATE INCREASE

(71) Applicant: Micron Technology, Inc., Boise, ID (US)

(72) Inventors: Yuan He, Tokyo (JP); Yutaka Ito, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/521,124

(22) Filed: Jul. 24, 2019

(65) Prior Publication Data
US 2020/0058343 A1 Feb. 20, 2020

Related U.S. Application Data

(63) Continuation of application No. 16/104,421, filed on Aug. 17, 2018, now Pat. No. 10,468,076.

(51) Int. Cl.
| | |
|---|---|
| *G11C 7/06* | (2006.01) |
| *G11C 11/406* | (2006.01) |
| *G11C 11/408* | (2006.01) |
| *G11C 11/4099* | (2006.01) |

(52) U.S. Cl.
CPC .............. *G11C 7/06* (2013.01); *G11C 11/406* (2013.01); *G11C 11/408* (2013.01); *G11C 11/4087* (2013.01); *G11C 11/4099* (2013.01)

(58) Field of Classification Search
CPC ....... G11C 7/06; G11C 11/406; G11C 11/408; G11C 11/4087; G11C 11/4099
See application file for complete search history.

(56) References Cited

U.S. PATENT DOCUMENTS

| | | | | |
|---|---|---|---|---|
| 5,883,831 | A | * | 3/1999 | Lopez ...................... G11C 7/24 365/185.04 |
| 8,873,324 | B2 | | 10/2014 | Park et al. |
| 2007/0030746 | A1 | | 2/2007 | Best et al. |
| 2014/0112086 | A1 | | 4/2014 | Park et al. |

(Continued)

FOREIGN PATENT DOCUMENTS

| | | |
|---|---|---|
| KR | 10-0784891 B1 | 12/2007 |
| WO | 2016-149140 A1 | 9/2016 |

OTHER PUBLICATIONS

PCT International Search Report & Written Opinion for PCT Application No. PCT/US2019/028770 dated Aug. 29, 2019; 12 Pages.

*Primary Examiner* — Ajay Ojha
(74) *Attorney, Agent, or Firm* — Fletcher Yoder, P.C.

(57) ABSTRACT

An apparatus may include an address counter to provide first address information and second address information. The first address information may include a first number of bits and the second address information may include a second number of bits that is smaller than the first number of bits. The address counter may perform a first updating operation. The first updating operation being such that the first address information is updated from a first initial value to a first final value. The address counter may also perform a second updating operation, the second updating operation being such that the second address information is updated from a second initial value to a second final value. In addition, the address counter may also perform the second updating operation at least twice per the first updating operation being performed once.

20 Claims, 23 Drawing Sheets

(56) References Cited

U.S. PATENT DOCUMENTS

| | | |
|---|---|---|
| 2015/0063049 A1 | 3/2015 | Yang |
| 2016/0005452 A1 | 1/2016 | Bae et al. |
| 2016/0027532 A1 | 1/2016 | Kim |
| 2017/0053715 A1 | 2/2017 | Kim et al. |

* cited by examiner

OPERATIONS OF ROW DECODER 84

| CASE | OPERATIONS |
|---|---|
| ① | ACCESS NORMAL CELL ARRAY IN RESPONSE TO RAA<0-15>(=RXTA<0-15>) |
| ② | ACCESS REDUNDANT CELL ARRAY IN RESPONSE TO RAA<0-4,12,13>(=RedA<0-6>) TO REPLACE DEFECTIVE NORMAL WL WITH REDUNDANT WL |
| ③ | REFRESH RESPECTIVE WL OF BLOCK-1 TO BLOCK-4 OF NORMAL CELL ARRAY SIMULTANEOUSLY IN RESPONSE TO RAA<0-13> (=CBR<0-13>). RAA<14,15>(=RXT<14,15>):DON'T CARE) |
| ④ | REFRESH REDUNDANT CELL ARRAY IN RESPONSE TO RAA<0-4,12,13>(=CBR<0-4,12,13>). (RAA<5-11,14,15>(=CBR<5-11>,RXT<14>,RXT<15>): DON'T CARE) REFRESH RATE FOR REDUNDANT CELL ARRAY IS DOUBLE OF REFRESH RATE FOR NORMAL CELL ARRAY. |

FIG. 7E

STATUS OF RXTA <0-16> IN CASE OF FULL-PRODUCT (HALF-D=L)
(EXTERNAL ADDRESS IS 17 BITS COMPOSED OF RXTO<0-16> WITH ARRAY SELECT BIT THAT IS RXTO<12>)

| HALF-D | RXTA<0> | RXTA<1> | RXTA<2> | RXTA<3> | RXTA<4> | RXTA<5> | RXTA<6> | RXTA<7> | RXTA<8> | RXTA<9> | RXTA<10> | RXTA<11> | RXTA<12> | RXTA<13> | RXTA<14> | RXTA<15> | RXTA<16> |
|---|---|---|---|---|---|---|---|---|---|---|---|---|---|---|---|---|---|
| L | RXTO<0> | RXTO<1> | RXTO<2> | RXTO<3> | RXTO<4> | RXTO<5> | RXTO<6> | RXTO<7> | RXTO<8> | RXTO<9> | RXTO<10> | RXTO<11> | RXTO<12> | RXTO<13> | RXTO<14> | RXTO<15> | RXTO<16> |

FIG. 8B

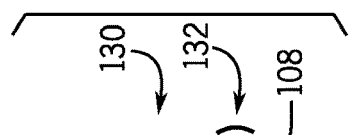

ADDRESS INFORMATION OF MULTIPLEXER 20H OUTPUT IS AS FOLLOWS:

☐ NORMAL ACCESS MODE (UNDER THIS MODE, MATCH IS AT L OR H DEPENDING ON WHETHER ACCESS ADDRESS IS DEFECTIVE ADDRESS OR NOT)

① IN CASE OF MATCH=L (MEANING ACCESS IS NOT DEFECTIVE ADDRESS SO THAT NORMAL AREA IS ACCESSED) — 134

| RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
|---|---|---|---|---|---|---|---|---|---|---|---|---|---|---|---|---|---|
| RXT0<0> | RXT0<1> | RXT0<2> | RXT0<3> | RXT0<4> | RXT0<5> | RXT0<6> | RXT0<7> | RXT0<8> | RXT0<9> | RXT0<10> | RXT0<11> | RXT0<12> | RXT0<13> | RXT0<14> | RXT0<15> | RXT0<16> | L (RXTB<17>) |

② IN CASE OF MATCH=H (MEANING ACCESS ADDRESS IS DEFECTIVE ADDRESS SO THAT REDUNDANT AREA IS ACCESSED) — 132, 108

| RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
|---|---|---|---|---|---|---|---|---|---|---|---|---|---|---|---|---|---|
| RedA<0> | RedA<1> | RedA<2> | RedA<3> | RedA<4> | RedA<5> | RedA<6> | RedA<7> | RXT0<8> | RXT0<9> | RXT0<10> | RXT0<11> | RedA<5> | RXT0<13> | Rea<6> | RXT0<15> | RXT0<16> | H (MATCH) |

☐ REFRESH MODE (UNDER THIS MODE, MATCH' IS HELD AT L)

③ IN CASE OF CBR<14>=L (MEANING REFRESH FOR NORMAL AREA) — 136

| RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
|---|---|---|---|---|---|---|---|---|---|---|---|---|---|---|---|---|---|
| CBR<0> | CBR<1> | CBR<2> | CBR<3> | CBR<4> | CBR<5> | CBR<6> | CBR<7> | CBR<8> | CBR<9> | CBR<10> | CBR<11> | CBR<12> | CBR<13> | CBR<15> | RXT0<15> | RXT0<16> | L (CBR<14>) |

④ IN CASE OF CBR<14>=H (MEANING REFRESH FOR REDUNDANT AREA) — 138

| RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
|---|---|---|---|---|---|---|---|---|---|---|---|---|---|---|---|---|---|
| CBR<0> | CBR<1> | CBR<2> | CBR<3> | CBR<4> | CBR<5> | CBR<6> | CBR<7> | CBR<8> | CBR<9> | CBR<10> | CBR<11> | CBR<12> | CBR<13> | CBR<15> | RXT0<15> | RXT0<16> | H (CBR<14>) |

FIG. 8F

OPERATIONS OF ROW DECODER 84

| CASE | OPERATIONS |
|---|---|
| ① | SELECT ONE OF NORMAL CELL ARRAYS 1 OR 2 IN RESPONSE TO RAA<12>(=RXTO<12>) AND ACCESS THE SELECTED NORMAL CELL ARRAY IN RESPONSE TO RAA<0-11, 13-16>(=RXTO<0-11, 13,-16>) |
| ② | SELECT ONE OF REDUNDANT CELL ARRAYS 1 OR 2 IN RESPONSE TO RAA<12>(=RedA<7>) AND ACCESS THE SELECTED REDUNDANT CELL ARRAY IN RESPONSE TO RAA<0-4, 13, 14>(RedA<0-6>) TO REPLACE DEFECTIVE NORMAL WL WITH REDUNDANT WL |
| ③ | REFRESH RESPECTIVE WL OF BLOCK-1 TO BLOCK-4 OF EACH OF NORMAL CELL ARRAYS 1 AND 2 SIMULTANEOUSLY IN RESPONSE TO RAA<0-11, 13, 14>(=CBR<0-13>). (RAA<12>(=CBR<15>) AND RAA<15, 16>(RXTO<15, 16>):DON'T CARE) |
| ④ | REFRESH REDUNDANT CELL ARRAYS 1 AND 2 SIMULTANEOUSLY IN RESPONSE TO RAA<0-4, 13, 14>(=CBR<0-4, 12, 13>). (RAA<5-11, 12>(=CBR<5-11, 15>) AND RAA<15, 16>(=RXTO<15, 16>):DON'T CARE) REFRESH RATE FOR EACH OF REDUNDANT CELL ARRAYS 1 AND 2 IS DOUBLE OF REFRESH RATE FOR EACH OF NORMAL CELL ARRAYS 1 AND 2. |

FIG. 8G

STATUS OF RXTV<0-16> IN CASE OF HALF-PRODUCT (HALF-D=H)
(EXTERNAL ADDRESS IS 16 BITS COMPOSED OF RXTO<0-15>  WITHOUT ARRAY SELECT BIT)

| HALF-D | RXTA<0> | RXTA<1> | RXTA<2> | RXTA<3> | RXTA<4> | RXTA<5> | RXTA<6> | RXTA<7> | RXTA<8> | RXTA<9> | RXTA<10> | RXTA<11> | RXTA<12> | RXTA<13> | RXTA<14> | RXTA<15> | RXTA<16> |
|---|---|---|---|---|---|---|---|---|---|---|---|---|---|---|---|---|---|
| H | RXTO<0> | RXTO<1> | RXTO<2> | RXTO<3> | RXTO<4> | RXTO<5> | RXTO<6> | RXTO<7> | RXTO<8> | RXTO<9> | RXTO<10> | RXTO<11> (L OR H) (FIXED) | RXTO<12> | RXTO<13> | RXTO<14> | RXTO<15> |  |

FIG. 8H

STATUS OF CBR<0-15> IN CASE OF HALF PRODUCT (HALF-D=H)

| HALF-D | CBR<0> | CBR<1> | CBR<2> | CBR<3> | CBR<4> | CBR<5> | CBR<6> | CBR<7> | CBR<8> | CBR<9> | CBR<10> | CBR<11> | CBR<12> | CBR<13> | CBR<14> | CBR<15> |
|---|---|---|---|---|---|---|---|---|---|---|---|---|---|---|---|---|
| H | CBR0<0> | CBR0<1> | CBR0<2> | CBR0<3> | CBR0<4> | CBR0<5> | CBR0<6> | CBR0<7> | CBR0<8> | CBR0<9> | CBR0<10> | CBR0<11> | CBR0<12> | CBR0<13> | CBR0<14> | L OR H (FIXED) UPON CBR0<14>=L; CBR0<15> UPON CBR0<14>=H |

FIG. 8I — 142

OUTPUT OF MULTIPLEXER 20G

| Ref | <0> | <1> | <2> | <3> | <4> | <5> | <6> | <7> | <8> | <9> | <10> | <11> | <12> | <13> | <14> | <15> | <16> | <17> |
|---|---|---|---|---|---|---|---|---|---|---|---|---|---|---|---|---|---|---|
| L | RXTB<0> | RXTB<1> | RXTB<2> | RXTB<3> | RXTB<4> | RXTB<5> | RXTB<6> | RXTB<7> | RXTB<8> | RXTB<9> | RXTB<10> | RXTB<11> | RXTB<12> | RXTB<13> | RXTB<14> | RXTB<15> | RXTB<16> | RXTB<17> |
|   | RXTA<0> | RXTA<1> | RXTA<2> | RXTA<3> | RXTA<4> | RXTA<5> | RXTA<6> | RXTA<7> | RXTA<8> | RXTA<9> | RXTA<10> | RXTA<11> | RXTA<12> | RXTA<13> | RXTA<14> | RXTA<15> | RXTA<16> | L |
| H | CBR<0> | CBR<1> | CBR<2> | CBR<3> | CBR<4> | CBR<5> | CBR<6> | CBR<7> | CBR<8> | CBR<9> | CBR<10> | CBR<11> | CBR<12> | CBR<13> | CBR<14> | CBR<15> | CBR<16> | CBR<14> |

FIG. 8J — 144, 146

OUTPUT OF MULTIPLEXER 20H

| MATCH | <0> | <1> | <2> | <3> | <4> | <5> | <6> | <7> | <8> | <9> | <10> | <11> | <12> | <13> | <14> | <15> | <16> | <17> |
|---|---|---|---|---|---|---|---|---|---|---|---|---|---|---|---|---|---|---|
| L | RXTB<0> | RXTB<1> | RXTB<2> | RXTB<3> | RXTB<4> | RXTB<5> | RXTB<6> | RXTB<7> | RXTB<8> | RXTB<9> | RXTB<10> | RXTB<11> | RXTB<12> | RXTB<13> | RXTB<14> | RXTB<15> | RXTB<16> | RXTB<17> |
|   | RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
| H | RedA<0> | RedA<1> | RedA<2> | RedA<3> | RedA<4> | RXTB<5> | RedA<6> | RedA<7> | RXTB<8> | RXTB<9> | RXTB<10> | RXTB<11> | RedA<5> | RedA<6> | RXTB<14> | RXTB<15> | RXTB<16> | MATCH |

FIG. 8K — 148, 150, 108

ADDRESS INFORMATION OF MULTIPLEXER 20H OUTPUT IS AS FOLLOWS:

☐ NORMAL ACCESS MODE (UNDER THIS MODE, MATCH IS AT L OR H DEPENDING ON WHETHER ACCESS ADDRESS IS DEFECTIVE ADDRESS OR NOT)

① IN CASE OF MATCH=L (MEANING ACCESS IS NOT DEFECTIVE ADDRESS SO THAT NORMAL AREA IS ACCESSED)

| RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
|---|---|---|---|---|---|---|---|---|---|---|---|---|---|---|---|---|---|
| RXTO<0> | RXTO<1> | RXTO<2> | RXTO<3> | RXTO<4> | RXTO<5> | RXTO<6> | RXTO<7> | RXTO<8> | RXTO<9> | RXTO<10> | RXTO<11> | L OR H (FIXED) | RXTO<12> | RXTO<13> | RXTO<14> | RXTO<15> | L (RXTB<17>) |

② IN CASE OF MATCH=H (MEANING ACCESS ADDRESS IS DEFECTIVE ADDRESS SO THAT REDUNDANT AREA IS ACCESSED)

| RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
|---|---|---|---|---|---|---|---|---|---|---|---|---|---|---|---|---|---|
| RedA<0> | RedA<1> | RedA<2> | RedA<3> | RedA<4> | RedA<5> | RedA<6> | RedA<7> | RXTO<8> | RXTO<9> | RXTO<10> | RXTO<11> | RedA<7> | RXTO<12> | Rea<6> | RXTO<14> | RXTO<15> | H (MATCH) |

☐ REFRESH MODE (UNDER THIS MODE, MATCH IS HELD AT L)

③ IN CASE OF CBR<14>=L (MEANING REFRESH FOR NORMAL AREA)

| RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
|---|---|---|---|---|---|---|---|---|---|---|---|---|---|---|---|---|---|
| CBR<0> | CBR<1> | CBR<2> | CBR<3> | CBR<4> | CBR<5> | CBR<6> | CBR<7> | CBR<8> | CBR<9> | CBR<10> | CBR<11> | L OR H (FIXED) | CBR<12> | CBR<13> | RXTO<14> | RXTO<15> | L (CBR<14>) |

④ IN CASE OF CBR<14>=H (MEANING REFRESH FOR REDUNDANT AREA)

| RAA<0> | RAA<1> | RAA<2> | RAA<3> | RAA<4> | RAA<5> | RAA<6> | RAA<7> | RAA<8> | RAA<9> | RAA<10> | RAA<11> | RAA<12> | RAA<13> | RAA<14> | RAA<15> | RAA<16> | RAA<17> |
|---|---|---|---|---|---|---|---|---|---|---|---|---|---|---|---|---|---|
| CBR<0> | CBR<1> | CBR<2> | CBR<3> | CBR<4> | CBR<5> | CBR<6> | CBR<7> | CBR<8> | CBR<9> | CBR<10> | CBR<11> | CBR<15> | CBR<12> | CBR<13> | RXTO<14> | RXTO<15> | H (CBR<14>) |

FIG. 8L

OPERATIONS OF ROW DECODER 84

| CASE | OPERATIONS |
|---|---|
| ① | SELECT OPERABLE ONE OF NORMAL CELL ARRAYS 1 AND 2 DESIGNATED BY RAA<12>(=L OR H (FIXED)) AND ACCESS THE OPERABLE NORMAL CELL ARRAY IN RESPONSE TO RAA<0-11, 13-16>(=RXT0<0-11, 12-15>), |
| ② | SELECT ONE OF REDUNDANT CELL ARRAYS 1 AND 2 IN RESPONSE TO RAA<12>(=RedA<7>) AND ACCESS THE SELECTED REDUNDANT CELL ARRAY IN RESPONSE TO RAA<0-4, 13, 12>(=RedA<0-4, 5, 6>) TO REPLACE DEFECTIVE NORMAL WL WITH REDUNDANT WL |
| ③ | SELECT OPERABLE ONE OF NORMAL CELL ARRAYS 1 AND 2 DESIGNATED BY RAA<12>(=L OR H (FIXED)) AND REFRESH RESPECTIVE WL OF BLOCK-1 AND BLOCK-4 OF THE OPERABLE NORMAL CELL ARRAY SIMULTANEOUSLY IN RESPONSE TO RAA<0-11, 13, 14> (=CBR<0-11, 12, 13>). (RAA<15, 16>(=RXT0<14, 15>):DON'T CARE) |
| ④ | SELECT ONE OF REDUNDANT CELL ARRAYS 1 AND 2 IN RESPONSE TO RAA<12>(=CBR<15) AND REFRESH THE SELECTED REDUNDANT CELL ARRAY IN RESPONSE TO RAA<0-4, 13, 14>(=CBR<0-4, 12, 13>). (RAA<5-11, 15, 16>(=CBR<5-11>, RXT0<14>, RXT0<15>):DON'T CARE) REFRESH RATE FOR EACH OF REDUNDANT CELL ARRAYS 1 AND 2 IS THE SAME AS THAT FOR OPERABLE NORMAL CELL ARRAY. |

FIG. 8M

REDUNDANCY AREA REFRESH RATE INCREASE

CROSS-REFERENCE TO RELATED APPLICATION

This application is a continuation of U.S. patent application Ser. No. 16/104,421, which was filed on Aug. 17, 2018, entitled "REDUNDANCY AREA REFRESH RATE INCREASE," the entirety of which is incorporated by reference herein for all purposes.

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include instructions executable by the processing circuitry to perform an operation and/or may include data to be used as an input for the operation. In addition, in some cases, data output from the operation may be stored in memory, for example, to enable subsequent retrieval.

The memory module may operate to retrieve or store data through commands that include addresses. These addresses correspond to locations in memory that are to be read from or written to as part of the operation. A row decoder may receive an address, interpret the address, and perform the requested operation to the data at the address. Furthermore, an address counter, such as a column before row address (CBR) counter, may maintain a count to facilitate tracking refresh operations of the memory module. During refresh operations, a normal word line is refreshed corresponding to the count maintained by the address counter. In certain refresh operations, redundant word lines are also to be refreshed using a count maintained separately from the count maintained by the described address counter. Thus, in these applications, utilizing a single address counter may be insufficient during refresh operations as two separate counts are to be maintained.

BRIEF DESCRIPTION OF THE DRAWINGS

Various aspects of this disclosure may be better understood upon reading the following detailed description and upon reference to the drawings in which:

FIG. 7E is a table depicting operations of the row of FIG. 7A in response to the operational scenarios of FIG. 7D, in accordance with an embodiment of this disclosure;

FIG. 8B is a table of an example address used by the memory device of FIG. 8A during the full-product memory operational mode, in accordance with an embodiment of this disclosure;

FIG. 8C is a table of a second example address used by the memory device of FIG. 8A during the full-product memory operational mode, in accordance with an embodiment of this disclosure;

FIG. 8D is a table of an output from the first multiplexer of FIG. 8A during the full-product memory operational mode, in accordance with an embodiment of this disclosure;

FIG. 8E is a table of an output from the second multiplexer of FIG. 8A during the full-product memory operational mode, in accordance with an embodiment of this disclosure;

FIG. 8F is a table of outputs from the second multiplexer of FIG. 8A in response to several operational scenarios during the full-product memory operational mode, in accordance with an embodiment of this disclosure;

FIG. 8G is a table depicting operations of the row decoder of FIG. 8A in response to the operational scenarios of FIG. 8F, in accordance with an embodiment of this disclosure;

FIG. 8H is a table of a third example address used by the memory device of FIG. 8A during the half-product memory operational mode, in accordance with an embodiment of this disclosure;

FIG. 8I is a table of a fourth example address used by the memory device of FIG. 8A during the half-product memory operational mode, in accordance with an embodiment of this disclosure;

FIG. 8J is a table of an output from the first multiplexer of FIG. 8A during the half-product memory operational mode, in accordance with an embodiment of this disclosure;

FIG. 8K is a table of an output from the second multiplexer of FIG. 8A during the half-product memory operational mode, in accordance with an embodiment of this disclosure;

FIG. 8L is a table of outputs from the second multiplexer of FIG. 8A in response to several operational scenarios during the half-product memory operational mode, in accordance with an embodiment of this disclosure; and FIG. 8M is a table depicting operations of the row decoder of FIG. 8A in response to the operational scenarios of FIG. 8L, in accordance with an embodiment of this disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
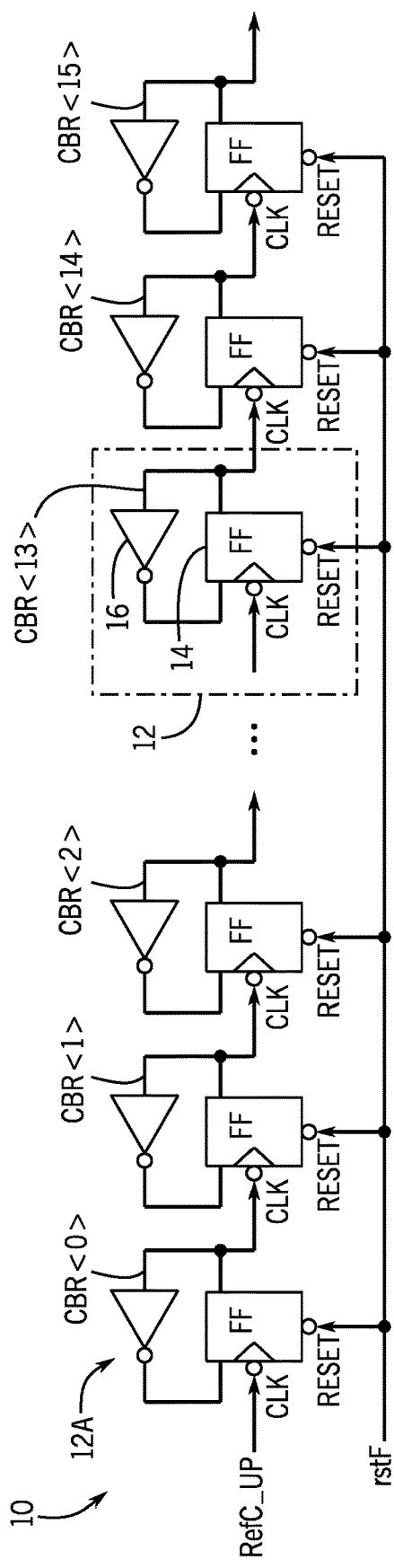
FIG. 1 is a block diagram of an example address counter that is well-known in the art.

As described herein, it may be advantageous to have an address counter to maintain two counts, where one count tracks refresh operations for normal word lines of the memory module and the other count tracks refresh operations for redundant word lines of the memory module. Typical address counters 10, an example of which is depicted in FIG. 1, are used in memory refresh operations. Address counters, such as the address counter 10, generally track the various rows, or word lines, of memory and indicate to external circuitry, for example, a row decoder, which row of memory is to be refreshed. The depicted circuit is a ripple counter type in which various counter stages 12 are coupled in series (e.g., cascade coupling). Each counter stage 12 includes a flip-flop 14 and an inverter 16 feeding back an output of the flip-flop 14 to the input of the flip-flop 14. Each counter stage 12 may receive a signal (rstF) as a reset signal to set the count value to an initial value (e.g., all 0s). A first counter stage 12A may also receive an incrementing signal (RefC_UP) that transitions from an inactive high level (e.g., logical high for the circuitry) to an active low level (e.g., logical low for the circuitry) each time one row address indicated by the address counter 10 has been refreshed. In this way, the counter value is updated by an increment value (e.g., one), where the counter value is represented by a series of bits corresponding to the individual outputs from each counter stage 12, for example the output (CBR<0>) from the counter stage 12A.

Memory cell arrays, however, may include normal word lines in addition to redundant word lines, where the refreshing of the rows, as described above, is a memory operation that operates to refresh normal word lines. These redundant word lines are substituted for normal word lines when found to be defective and/or are otherwise classified as "defective row addresses." Moreover, it may be useful to operate the memory cell array with an any-to-any row-redundancy scheme where any defective normal word line may be replaced by any redundant word line. This any-to-any row-redundancy scheme operates through successively refreshing the normal word lines and moving the refresh operations to the redundant word lines. Through usage of the any-to-any row-redundancy scheme, a memory device having a number of defective normal word lines that exceeds a number of corresponding redundant word lines within a memory cell array may be operated as a half-product (as opposed to a full-product) memory device that permits a portion of the redundant word lines to be associated with a second memory cell array of the memory device.

It should be noted that in any given embodiment, the number of normal word lines may outnumber the number of redundant word lines. For example, one embodiment may have 16,384 normal word lines (e.g., $2^{14}$) and 128 redundant word lines (e.g., $2^7$) per memory block or bank. For ease of description, this example is continued throughout this disclosure, and thus 14 addressing bits are used to access the normal word lines while 7 addressing bits are used to access to the redundant word lines. It should be understood, however, that any suitable number of normal word lines and/or redundant word lines may be used in a memory device using the techniques presented in this disclosure.

To use either redundant word lines and/or normal word lines, voltages (data associated with each word line) are to be periodically refreshed. These refreshing operations may be tracked at least in part by address counters, such as the address counter 10. Thus, it may be desirable for a single address counter to track both the number of normal word line refreshes and the number of the redundant word line refreshes, where the number corresponds to an indication of an address to use in the refresh operation. To satisfy this operational constraint, a modified address counter may be used to change the respective cycle counts between refreshing normal word lines and redundant word lines. This modified address counter may also facilitate refreshing word lines (e.g., memory) at two separate refresh rates to help improve memory device operation, such as to mitigate at least in part the row hammer effect that afflicts dynamic random-access memory (DRAM) and causes memory cells to leak charges and/or electrically interact between themselves.

Figure 2A:
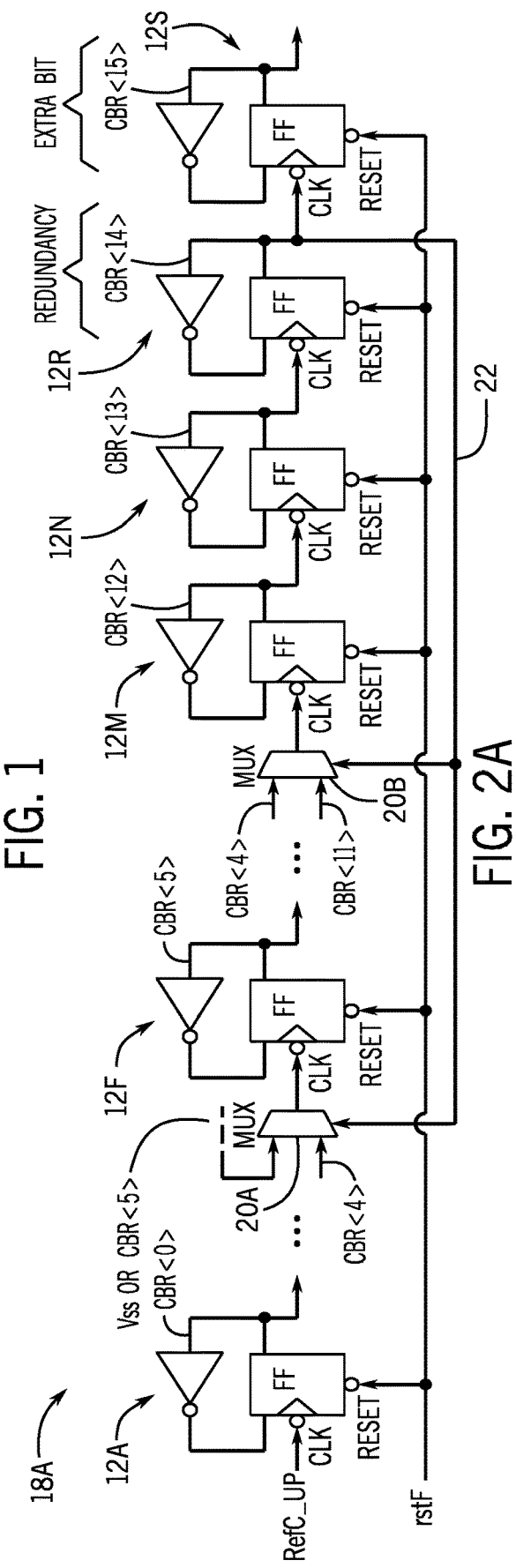
FIG. 2A is a block diagram of an example address counter to be used in an any-to-any row-redundancy scheme, in accordance with a first embodiment of this disclosure.

To help illustrate, FIG. 2A is a block diagram of an example modified address counter 18A that may be used in an any-to-any row-redundancy scheme. This address counter 18A includes multiplexer 20A and multiplexer 20B circuitry along with an electrical coupling 22 to transmit a selection signal from a counter stage 12R to the multiplexer 20B and the multiplexer 20A and transmit the selection signal as an input into counter stage 12R and counter stage 12S. The counter stage 12R may be used for redundancy and the counter stage 12S may be used as a spare counter stage 12, but as will be appreciated, have outputs that may be leveraged to facilitate any-to-any row-redundancy schemes. During operation, the address counter 18A produces fourteen address bits using counter stages 12A-12N for the normal word lines and produces seven address bits using counter stages 12A-12E, 12M, and 12N for the redundancy word lines.

The address counter 18A is operated to track row refreshing for the normal word lines by incrementing the address used for the normal word line refreshing by a set value (e.g., 1) each time the incrementing signal (RefC_UP) transitions from low to high (e.g., from logical low to logical high, from 0 to 1). Similarly, the address counter 18A is operated to track row refreshing for the redundant row lines by incrementing the address used for the redundant row lines refreshing by a set value (e.g., 1) each time the incrementing signal (RefC_UP) transitions from low to high. In this way, the address counter 18A is able to increment the set value from an initial value or address (e.g., all 0s) to a maximum (or final) value or address (e.g., all 1s). It should be noted that each bit associated with counter stages 12F-12L (e.g., CBR<5-11>) is held at a low level (e.g., 0) during the refresh operations for the redundant row lines because the flip-flop 14 associated with the counter stage 12F receives a logical low voltage (Vss) level.

Figure 2B:
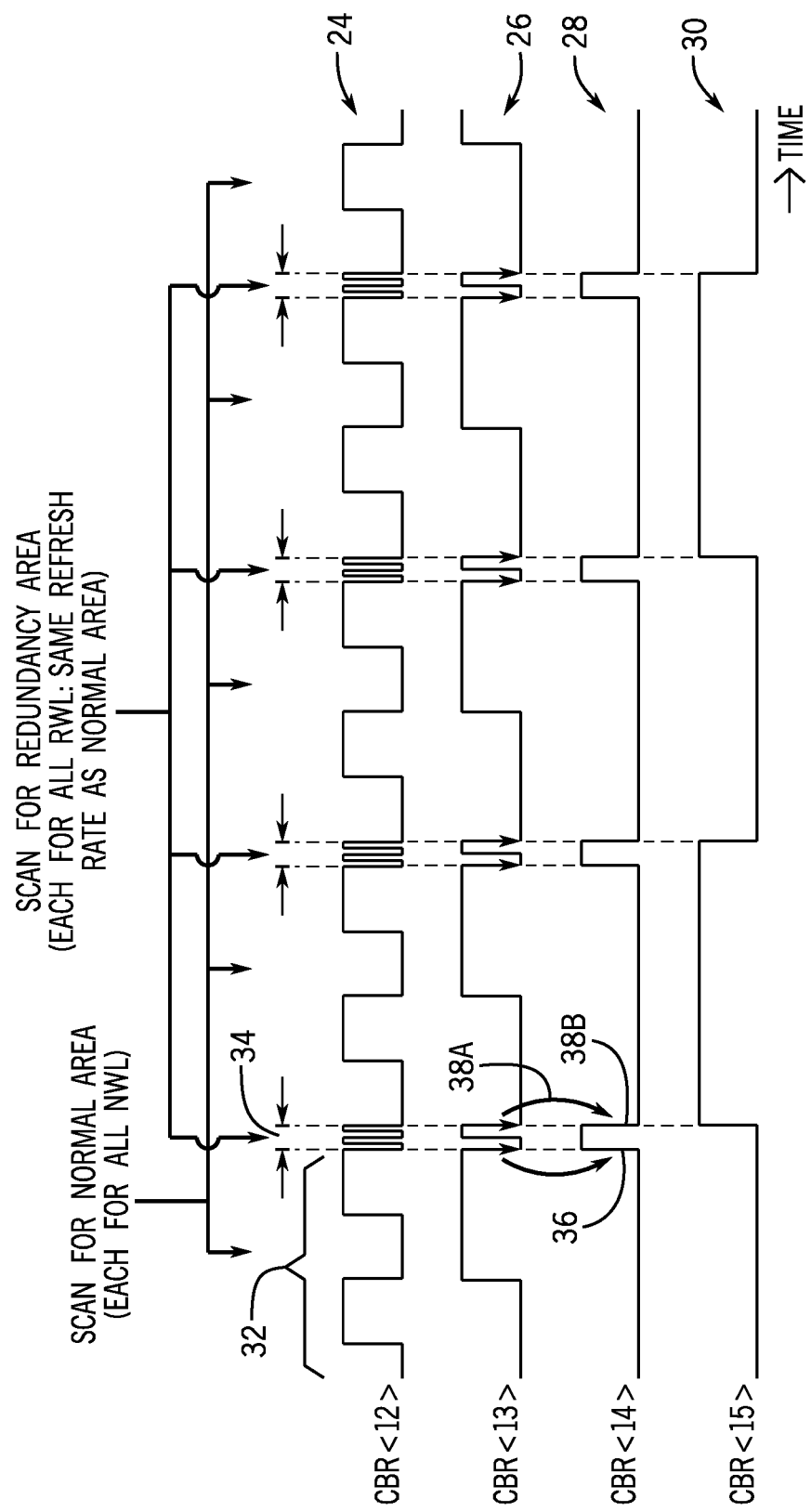
FIG. 2B is a timing diagram associated with operation of the address counter of FIG. 2A, in accordance with the first embodiment of this disclosure.

To help illustrate, FIG. 2B is a timing diagram associated with operation of the address counter 18A including a signal 24 (CBR<12>) corresponding to the counter stage 12M, a signal 26 (CBR<13>) corresponding to the counter stage 12N, a signal 28 (CBR<14>) corresponding to the counter stage 12R, and a signal 30 (CBR<15>) corresponding to the counter stage 12S. Each signal depicted generally transmits from a previous counter stage 12 as a clocking signal for a next counter stage 12. Thus, for example, the signal 24 is based off the incrementing signal (RefC_Up) transmitted initially to the counter stage 12A. The bit value represented by the signal 24 may change at two different frequencies over time to facilitate the any-to-any row redundancy scheme, where the first frequency may occur during period 32 and the second frequency may occur during period 34. The frequency change occurs in response to a change in output from the multiplexer 20B to the counter stage 12M. In addition, the multiplexer 20A and the multiplexer 20B may change state in response to rising edges of the signal 28 (CBR<14>), such as the rising edge 36, and permit redundant word line refresh operations to occur.

As described above, in the redundant word line refresh operations, the address counter 18A changes inputs to some of the counter stages 12 to change the counter stages 12 used as a refreshing address indicating the redundant word line of memory to be refreshed. While operating to refresh redundant word lines, the multiplexer 20A changes state to cause the Vss level to transmit as the clocking signal to counter stage 12F and the multiplexer 20B changes state to cause the output from counter stage 12E (not depicted in FIG. 2A but understood to be disposed sequential to counter stage 12F) to transmit as the clocking signal to counter stage 12M, effectively bypassing the address contribution from counter stages 12F to 12L. For the period 34, where the signal 28 is high, the refreshing operations use a different address represented by counter stages 12A-12E, 12M, and 12N. After several incrementing signal (RefC_Up) transitions, a falling edge 38A of the signal 26 causes the falling edge 38B of the signal 28, thereby enabling the address counter 18A to return to a normal row refresh state. While performing normal word line refresh operations, the multiplexer 20A and the multiplexer 20B may be returned to their original state and permit sequential transmission of the various signals from the various counter stages 12. Circuitry external to the address counter 18A, such as refreshing circuitry, receives the bit indicated by the address counter 18A and uses the data to determine which row is to be refreshed as part of refreshing operations.

Figure 3A:
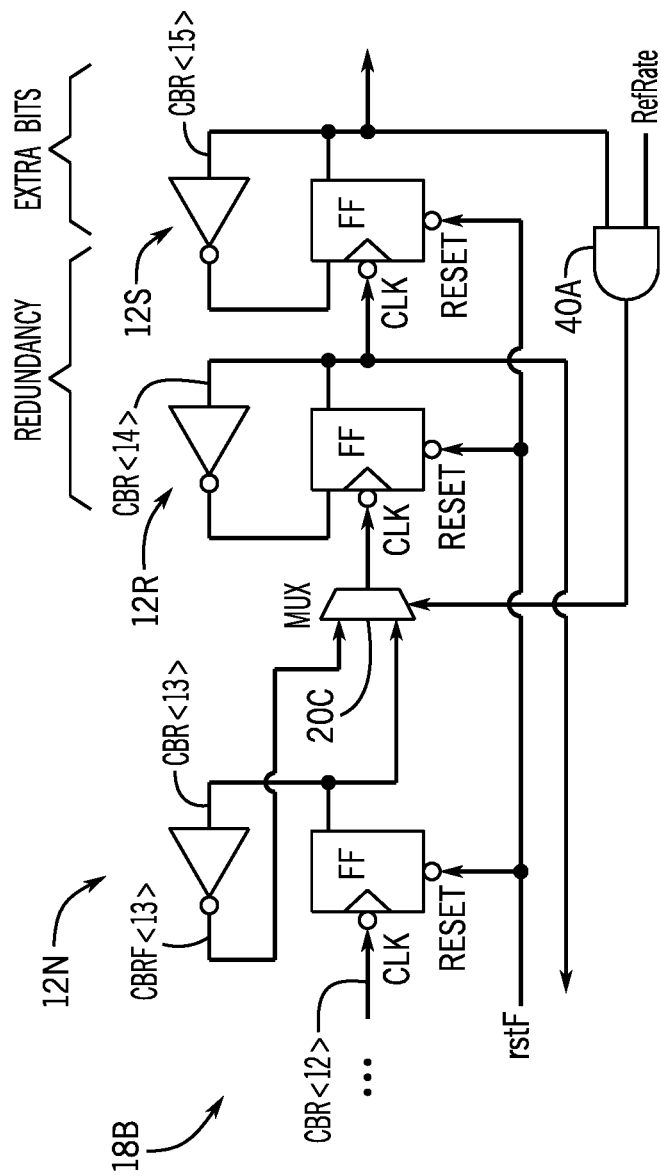
FIG. 3A is a block diagram of a second example address counter to be used in an any-to-any row-redundancy scheme, in accordance with a second embodiment of this disclosure.

FIG. 3A is a block diagram of a second example address counter 18B to be used in an any-to-any row-redundancy scheme and includes components of the address counter 18A in addition to a multiplexer 20C and a logical gate 40A. The multiplexer 20C is included to optionally supply either the output (CBR<13>) or inverse output (CBRF<13>) from the counter stage 12N to the counter stage 12R. The logical gate 40A is included to control switching of the multiplexer 20C based the output (CBR<15>) of the counter stage 12S and a refresh rate signal (RefRate). Although depicted as an AND gate, it should be understood that logical gates, such as the logical gate 40A, may be a variety of suitable logical gates based on the embodiment, such as NAND, OR, XOR, NOR, or the like. The refresh rate signal (RefRate) is active when the refresh cycle of the redundant word lines increases. For example, during operation of the address counter 18B, there may be certain times when the refresh rate of the redundant word line is twice the refresh rate of the normal word lines. When both the refresh rate signal (RefRate) and the output of the counter stage 12S are a logical high, the logical gate 40A outputs a logical high. While the logical gate 40A outputs a high signal, the multiplexer 20C switches to output the inverse output from the counter stage 12N. The address counter 18B may increase the ability of each redundant word line to be replaced over the address counter 18A.

Figure 3B:
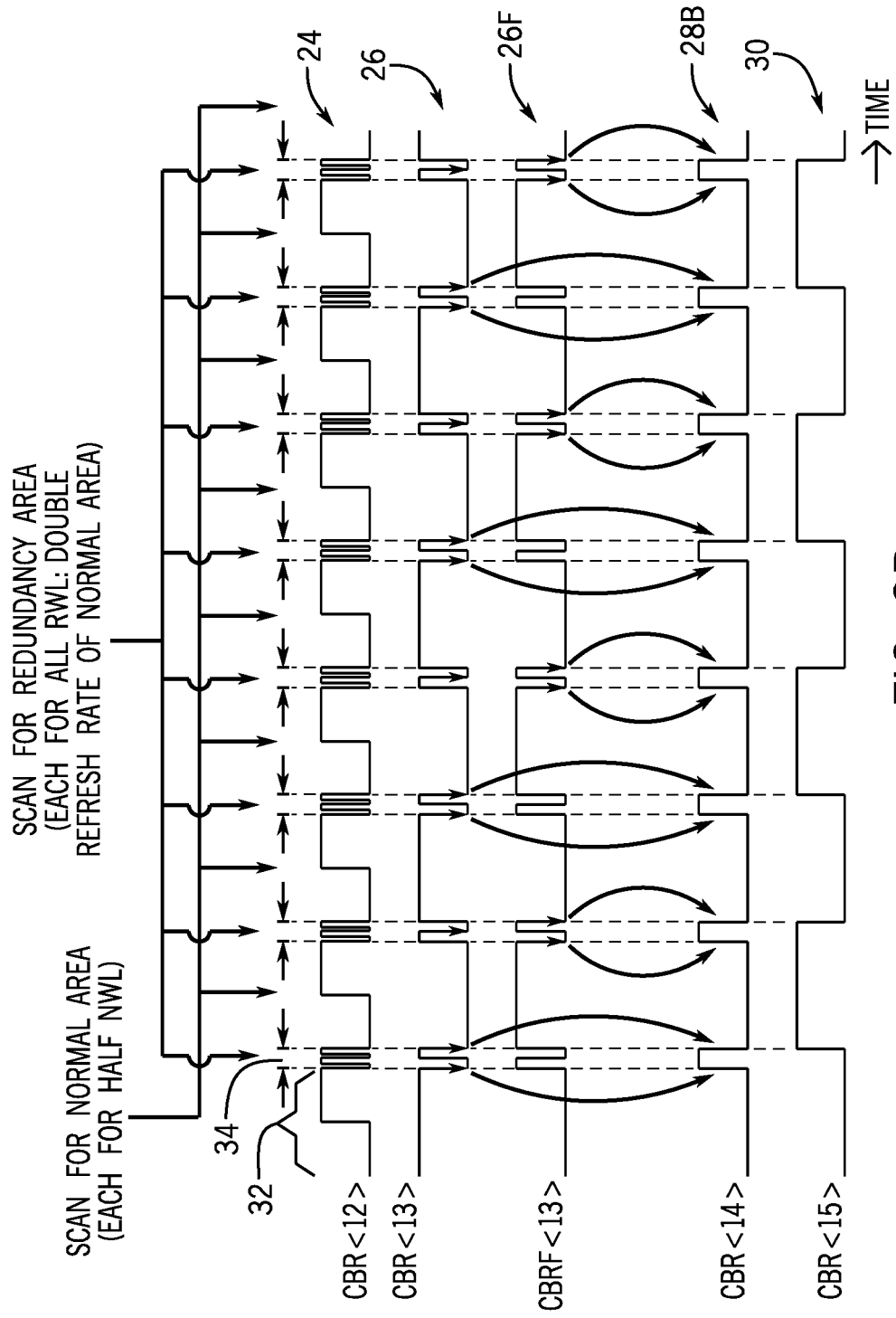
FIG. 3B is a timing diagram associated with operation of the address counter of FIG. 3A, in accordance with the second embodiment of this disclosure.

FIG. 3B is a timing diagram associated with operation of the address counter 18B including the signal 24 corresponding to the output (CBR<12>) from counter stage 12M, the signal 26 corresponding to the output (CBR<13>) from the counter stage 12N, a signal 26F corresponding to an inverse output (CBRF<13>) from the counter stage 12N, a signal 28B corresponding to the output (CBR<14>) from the counter stage 12R, and the signal 30 corresponding to the output (CBR<15>) from the counter stage 12S. As is apparent from the timing diagram of FIG. 3B, the signal 28B transitions to logical high at a double rate as compared to the signal 28 of FIG. 2B. Refreshing for a half of the normal word lines and refreshing for each of the redundant word lines may be performed alternatively when using the address counter 18B, and in this way, the refresh rate of the redundant word lines becomes double the refresh rate of the normal word lines.

Similar to the address counter 18A, the address counter 18B facilitates redundant word line refreshing using an address generated by counter stages 12A-12E, 12M, and 12N during the period 34. However, in the address counter 18B, the output (CBR<13>) and the inverted output (CBRF<13>) from the counter stage 12N are leveraged for redundant word addresses. In this way, the period 34 occurs twice as often as in the address counter 18A. Since the refresh rate of the redundant word lines has doubled compared to the timing diagram associated with the address counter 18A, the period 34 remains a consistent duration while the period 32 associated with normal word line refreshing decreases to half the duration of the period 34.

In the address counter 18B, refreshing of the redundant word lines is performed twice until completion of refreshing of all of the normal word lines, such that a total refreshing period of time for normal word lines and redundant word lines is somewhat prolonged compared to the address counter 18A. However, such prolongation is merely 0.78% (e.g., 128 redundant word lines divided by 16,384 normal word lines). In this way, using the address counter 18B may cause no substantial damage to refreshing operations associated with the normal word lines and the redundant word lines.

Figure 4A:
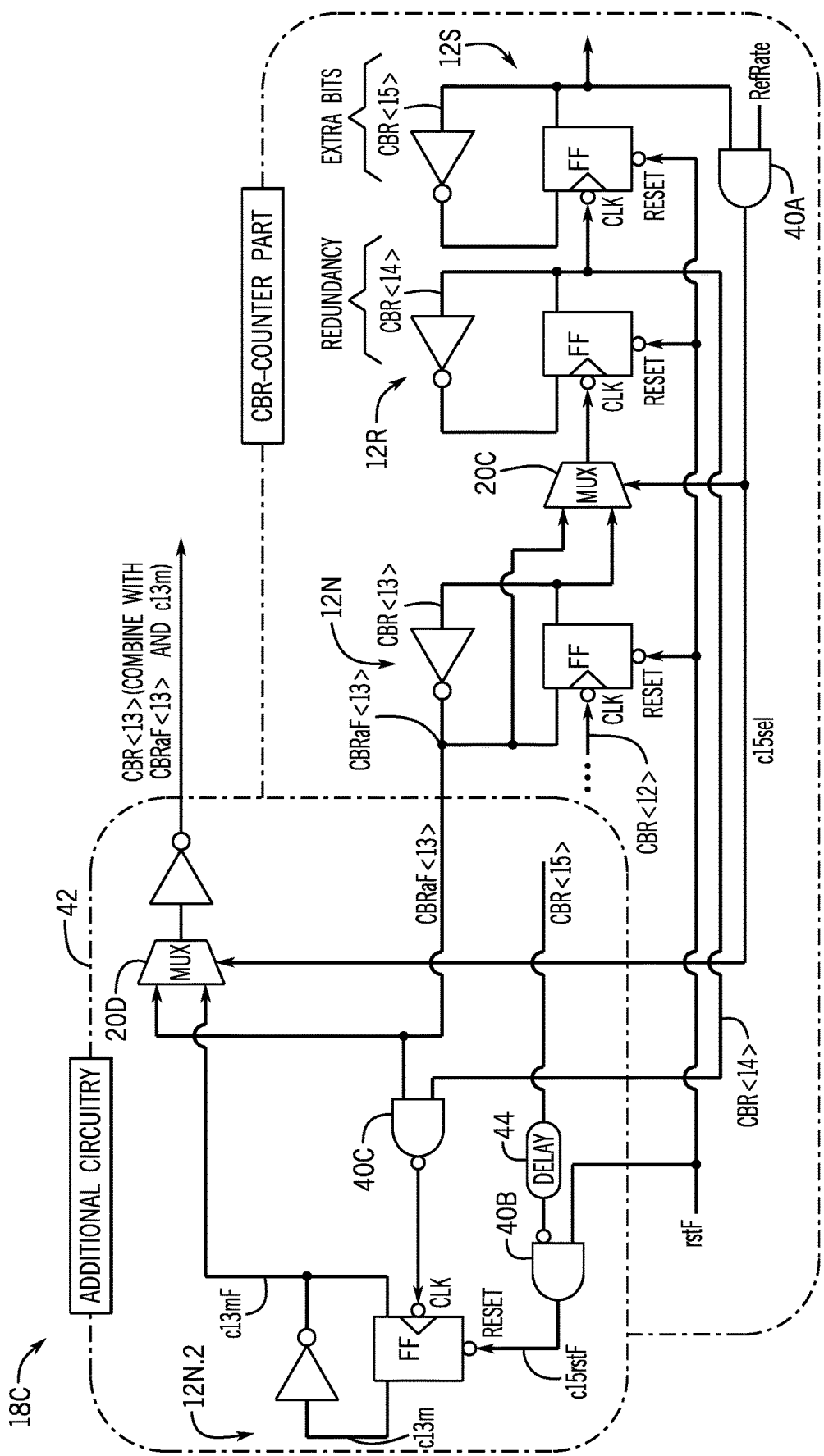
FIG. 4A is a block diagram of a third example address counter to be used in an any-to-any row redundancy scheme, in accordance with a third embodiment of this disclosure.

FIG. 4A is a block diagram of a third example address counter 18C to be used in an any-to-any row redundancy scheme and includes the components of address counter 18B in addition to additional circuitry 42. The additional circuitry 42 includes a counter stage 12N.2, logical gate 40B, logical gate 40C, a multiplexer 20D, and delay block 44. The output from the counter stage 12N.2 may replace the counter stage 12N in the final address transmitted from the address counter 18C. If the counter stage 12N were to be used as the fourteenth or seventh bit position, as previously used in address counter 18A and in address counter 18B, two scenarios alternately occur with respect to redundant word line refreshing. The first scenario is that redundant word line refreshing starts at a rising edge of the output (CBR<13>) from the counter stage 12N. The second scenario is that the redundant word line refreshing starts as a falling edge of the output (CBR<13>) from the counter stage 12N. This may cause the refresh rate to be varied. To correct this, the counter stage 12N.2 receives an input from the output of the counter stage 12N. In this way, the output currently corresponding to the fourteenth or seventh bit position of the address includes a combination of the output from the counter stage 12N and the output from the counter stage 12N.2, as is further discussed below. When initiating redundant word line refreshing based on the combination signal, the redundant word line refreshing may start at the falling edge of the output from the counter stage 12N.2 permitting a consistent refresh rate.

Figure 4B:
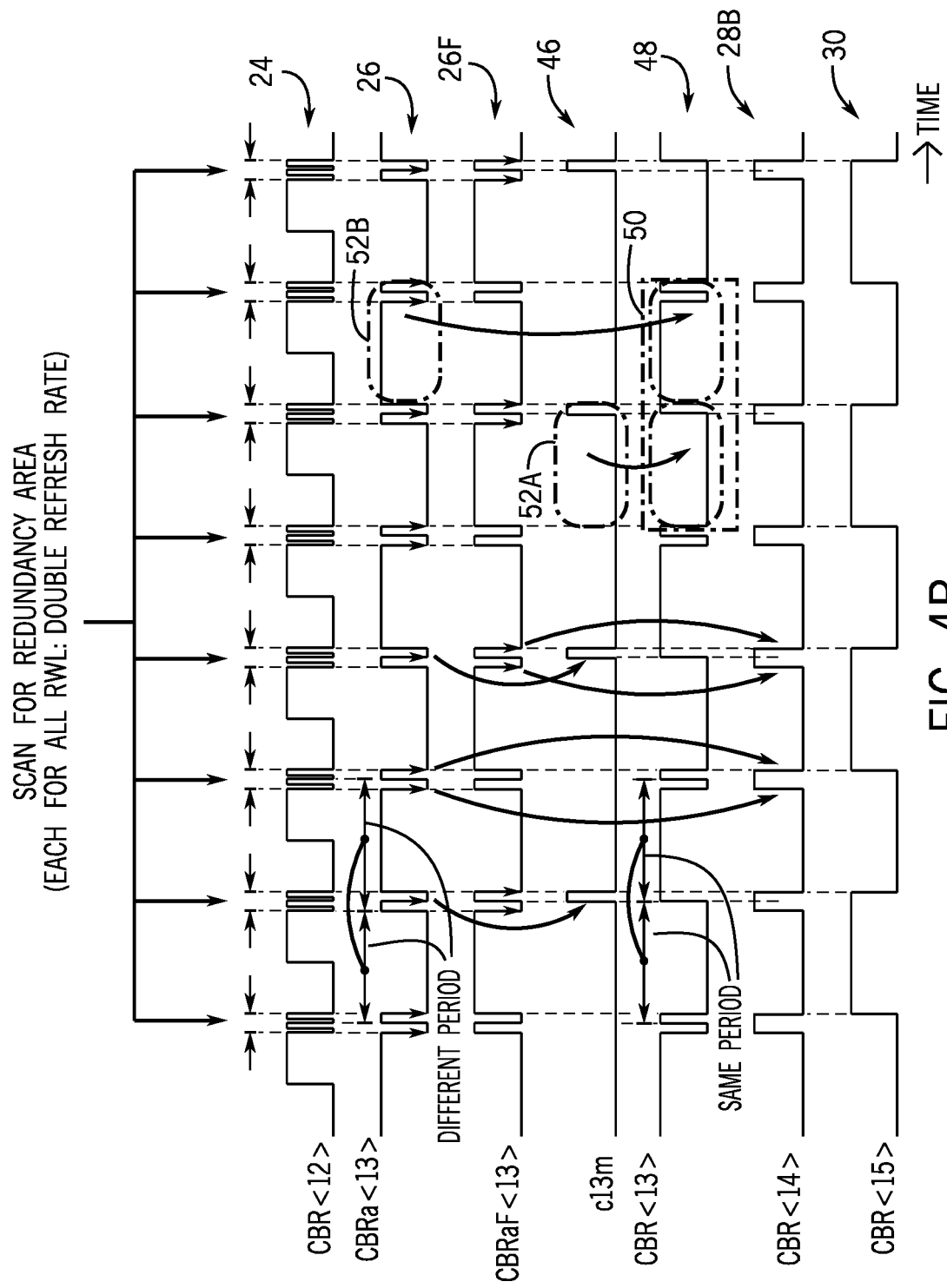
FIG. 4B is a timing diagram associated with operation of the address counter of FIG. 4A, in accordance with the third embodiment of this disclosure.

To help explain, FIG. 4B is a timing diagram associated with operation of the address counter 18C that includes the signal 24 corresponding to counter stage 12M, the signal 26 corresponding to the output of the counter stage 12N (e.g., now labeled CBRa<13>), the signal 26F corresponding to the inverse output of the counter stage N (e.g., now labeled CBRaF<13>), a signal 46 associated with the additional circuitry 42 (e.g., c13m), a signal 48 corresponding to the output (e.g., now labeled CBR<13>) of the additional circuitry 42, the signal 28B corresponding to the output of the counter stage 12R (e.g., CBR<14>), and the signal 30 corresponding to the output of the counter stage 12S (e.g., CBR<15>). The consolidation of the signal 46 and the signal 26 into the signal 48 via the additional circuitry 42 causes no change in the overall refresh and reset operations that occur during an any-to-any row redundancy scheme (evidenced by the unchanged signal characteristics of the signal 28B, used to manage the refreshing modes), at least based on the timing diagram of FIG. 4B. As depicted, a duration 50 of the period of the signal 48 corresponding to the output from the additional circuitry 42 includes a duration 52A and a duration 52B. The duration 52A corresponds to a portion of the signal 26 while the duration 52B corresponds to a portion of the signal 46. This consolidation occurs due at least in part to the switching of the multiplexer 20D and the multiplexer 20C, similar to the multiplexer 20 switching described previously in FIG. 3B and FIG. 2B. After switching of the multiplexer 20D, referring briefly to FIG. 2A, the output from the additional circuitry 42 changes from the output of the counter stage 12N.2 to the output from the counter stage 12N, therefore consolidating the respective outputs (c13mF, CBRaF<13>) into the output (CBR<13>) from the additional circuitry 42.

In the above examples, address counter 18A, address counter 18B, and address counter 18C, the number of redundant word lines may be a value other than a value that is a power of 2. For example, the number of redundant word lines may be reduced from 128 (e.g., $2^7$) to 96 (e.g., a value between $2^6$ and $2^7$). In this case, the address counter 18 may return to the initial value (e.g., 0) when the count reaches the final value minus 1 (e.g., 95), since the count begins at the initial value.

Figure 5A:
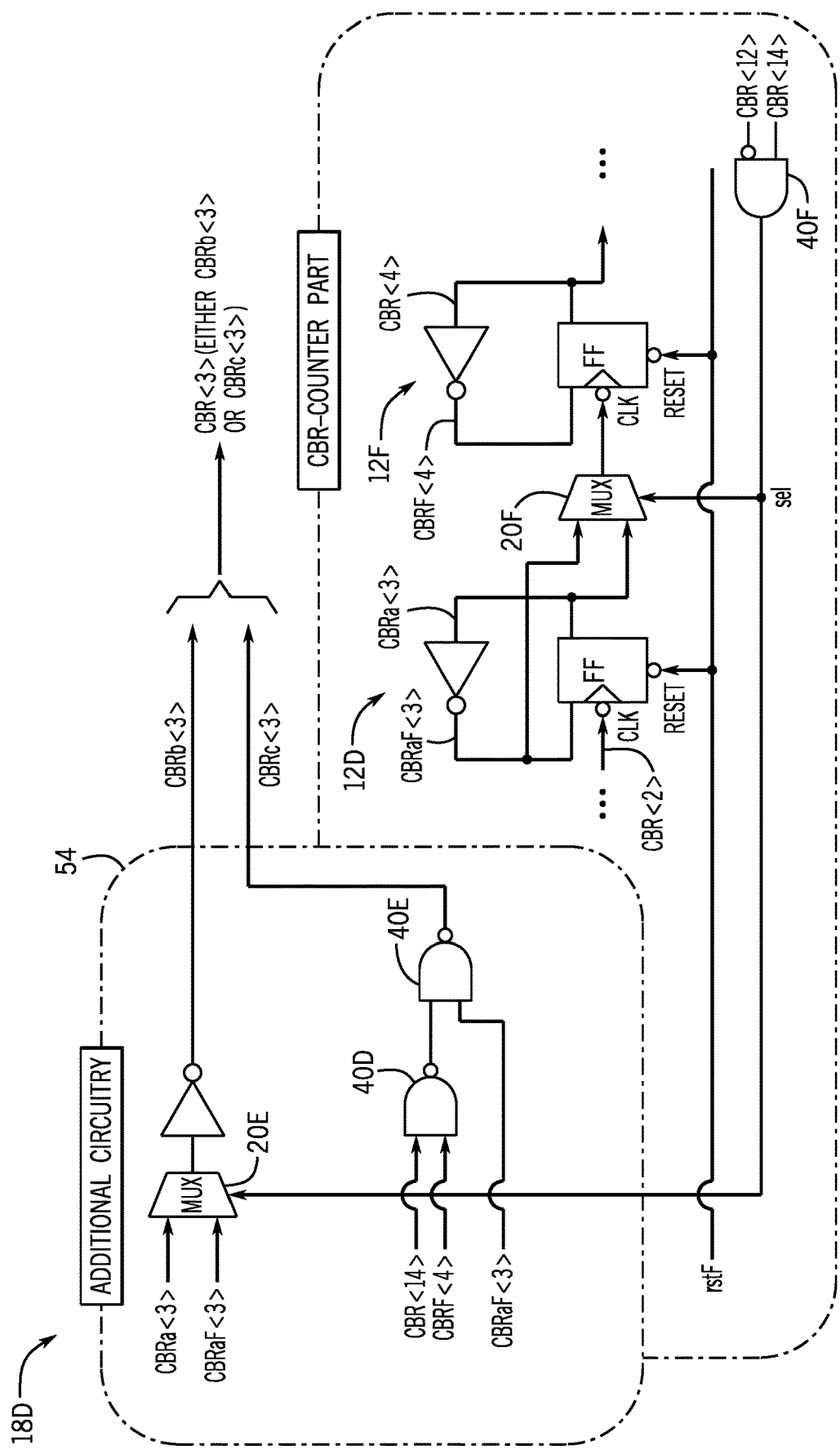
FIG. 5A is a block diagram of a fourth example address counter to be used in an any-to-any row-redundancy scheme, in accordance with a fourth embodiment of this disclosure.

FIG. 5A is a block diagram of a fourth example address counter 18D that realizes the above-presented use case of a memory system having a number of redundant word lines not equal to a power of 2. The address counter 18D may be used in an any-to-any row-redundancy scheme and accommodates any number of redundant word lines by reducing the range of the address counter 18D corresponding to the redundant row refresh operation by 75%, from 128 to 96, which manifests as a decrease from 127 to 95 in the final value of the address counter 18D. As depicted, the address counter 18D includes additional circuitry 54 and the circuitry of address counter 18B. The additional circuitry 54 includes a multiplexer 20E, as well as logical gate 40D and logical gate 40E, both operating as NAND gates, though it should be noted that in some embodiments these logical gates may be any suitable logical gate. The output (CBRa<3>) and the inverted output (CBRaF<3>) from the counter stage 12D are provided as inputs to the multiplexer 20E. The multiplexer 20F may operate to select the output from the counter stage 12D based on a selection signal that changes state in response to a logical gate 40F receiving an input (CBR<12>) from the counter stage 12M inverted output and an input (CBR<14>) from the counter stage 12R output. Through usage of the output (CBR<14>) from the counter stage 12R as a gatekeeping signal to initiate the counting range reduction, the counting range reduction occurs in response to the counter stage 12R output (CBR<14>) indicating a logical high, which, as explained earlier, occurs during the redundant word line refreshing and not during the normal word line refreshing. Thus, this operation does not affect the counting range used to provide an address to be used during normal word line refreshing.

Figure 5B:
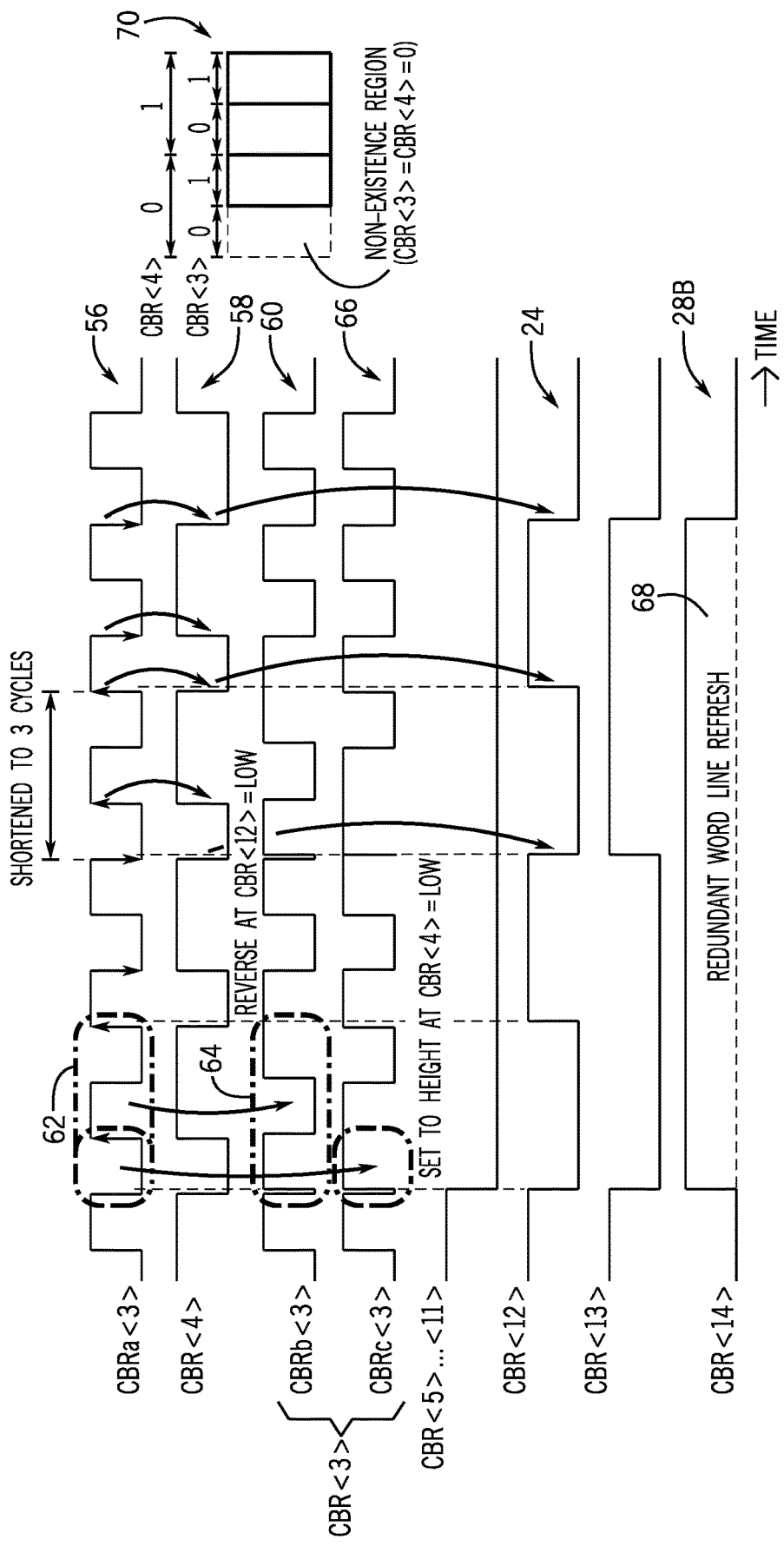
FIG. 5B is a timing diagram associated with operation of the address counter of FIG. 5A, in accordance with the fourth embodiment of this disclosure.

To help elaborate, FIG. 5B is a timing diagram associated with operation of the address counter 18D including a signal 56 corresponding to an output from the counter stage 12D, a signal 58 corresponding to an output from the counter stage 12E, the signal 28B corresponding to the output from the counter stage 12R of the address counter 18D (not depicted in FIG. 5A), and the signal 24 corresponding to the output from the counter stage 12M of the address counter 18D (not depicted in FIG. 5A). To reduce the counting range of the address counter 18D used for addressing redundant word lines to be refreshed, the additional circuitry 54 is included in the address counter 18D and electrically coupled to several components, as described above. The effect of including the additional circuitry is shown in the timing diagram, notably that the period of the output from the counter stage 12D has been reduced to three cycles from four cycles. This reduction corresponds to the desired 75% reduction of counting range. The timing diagram also conceptually shows how the incrementing signal (RefC_Up) that propagates through the address counter 18D slows, or decreases in frequency, as the incrementing signal (RefC_Up) is transmitted through each flip flop. The decrease in frequency of the clock signal helps assign magnitudes to the bit positions, such that the more significant bits represented by the outputs of the counter stages 12 that change state at a slower frequency than the counter stages 12 of the less significant bits (e.g., CBR<12> change less frequently than CBR<4>, a less significant bit).

The timing diagram also depicts the effect of the signal 24 being used as an input to the logical gate 40F. While the signal 24 is low and the signal 28B is high, the multiplexer 20E is operated to switch from transmitting the signal 20E as signal 60 (CBRb<3>) to transmitting an inverted version (CBRaF<3>) of the signal 56 (not depicted on the timing diagram) as the signal 60. This switching is depicted in the timing diagram as the inversion of portion 62 of signal 56 to become portion 64 of signal 60 (CBRb<3>). In addition, the relationships between the signal 28B, the signal 58, and the inverted signal 56 are used to generate a signal 66 (CBRc<3>) outputted from logic gate 40E. The signal 66 is high when the output from the counter stage 12R (e.g., the signal 28B) matches the inverse of the output from the counter stage 12E (e.g., the signal 58) if opposite the inverse of the signal 56 and is low if the same as the inverse of the signal 56. In addition, the signal 66 is low when the output from the counter stage 12R (e.g., the signal 28B) does not match the inverse of the output from the counter stage 12E (e.g., the signal 58) if the inverse of the output from the counter stage 12D (e.g., CBRaF<3>) is high or is high if the inverse of the output from the counter stage 12D (e.g., CBRaF<3>) is low. In this way, the signal 66 indicates the relationship between the signal 28B, the inverse of the signal 58 (e.g., CBRF<4>), and the inverse of the signal 56 (CBRaF<3>) transmitted through the logic gate 40D and the logic gate 40E. For addressing, either the signal 66 (e.g., CBRc<3>) or the signal 60 (e.g., CBRb<3>) may be used.

When including the additional circuitry 54 and operating the address counter 18D as described above to reduce the range of the address counter 18C, the address output of the address counter 18D changes for the redundant word lines and does not change for the normal word lines. This occurs because of the dependency on the signal 28B outputted from the counter stage 12R, which acts as an arbitration signal to facilitate the redundant word line refreshing during a duration 68. When the signal 28B is high, redundant word line refresh operations are permitted to occur, and the clock signal received by the counter stage 12E is driven to VSS, or a system logical low voltage, as depicted during the duration 68. Since the address counter 18D operates to decrease the counting range referenced for the redundant word line refresh operations, the counting range associated with normal word line refresh operations is left unchanged.

In addition, the address output may skip a portion of addresses represented in an original address map (e.g., referenced during logical to physical address translations) which may alter or cause inaccuracies in the actual refreshing operations. For example, the logical address represented through the address counter 18D may not translate into a physical address to be refreshed. The reduction is illustrated via inset graph 70, which represents the 75% counting range reduction discussed above that may occur when two counter stage 12 outputs are both low at the same time. To compensate for the reduction, a memory map referenced by the refreshing circuitry may also be reduced by a variety of suitable methods to compensate for the decreased range of the address counter 18D.

Figure 6A:
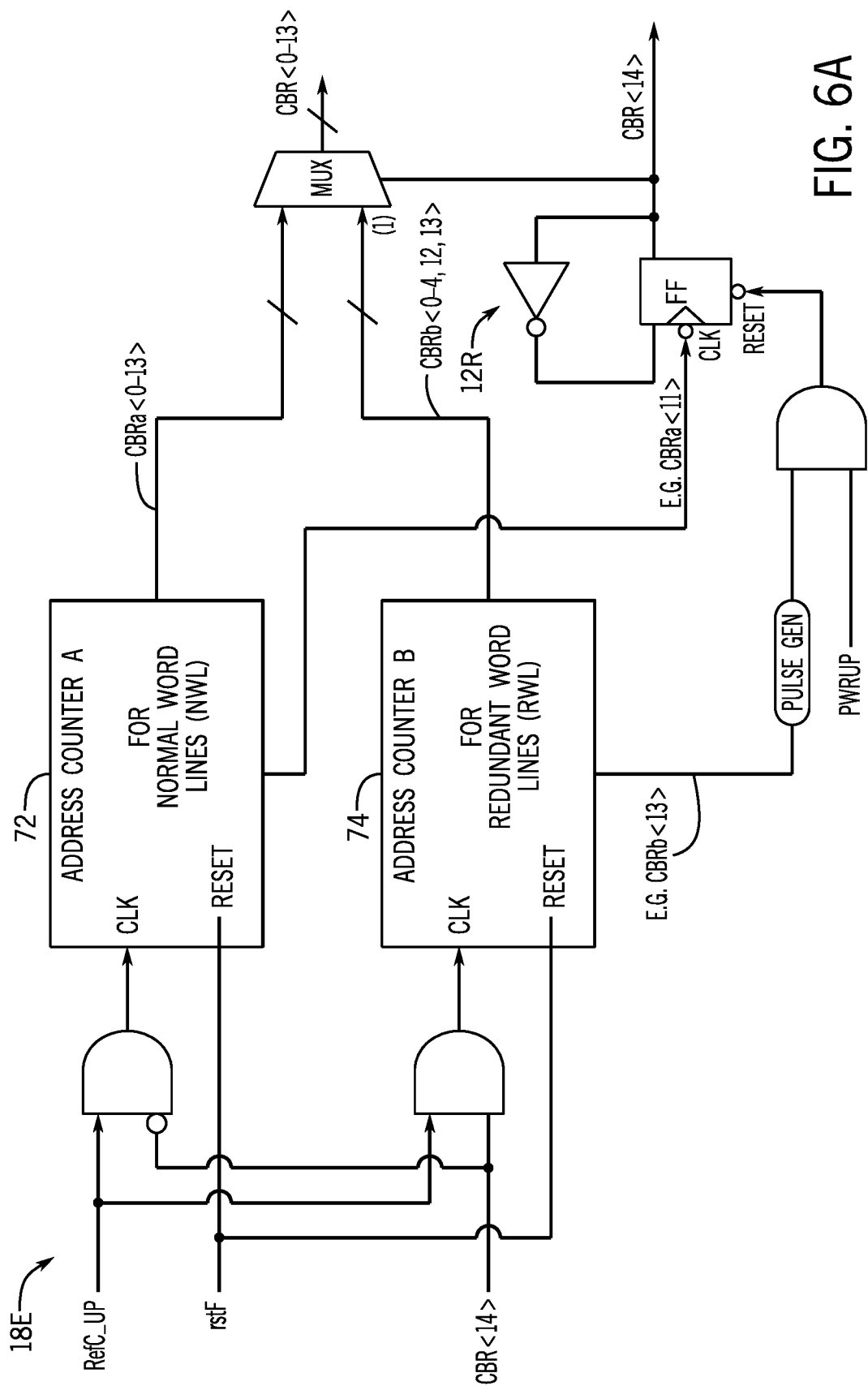
FIG. 6A is a block diagram of a fifth example address counter to be used in an any-to-any row-redundancy scheme, in accordance with a fifth embodiment of this disclosure.

In some embodiments, a refresh rate of the redundant word lines may be more than double the refresh rate of the normal word lines. To help illustrate, FIG. 6A is a block diagram of a fifth example address counter 18E to be used in an any-to-any row-redundancy scheme where the refresh rate for the redundant word line is at least double the refresh rate of the normal word lines. The address counter 18E includes a normal word line (NWL) address counter 72 and a redundant word line (RWL) address counter 74. The NWL address counter 72 includes circuitry of address counter 18A without the counter stage 12R and the counter stage 12S for the use-case example of 16,384 normal word lines to be refreshed. The RWL address counter 74 includes circuitry of the address counter 18A without the counter stage 12F through the counter stage 12K, counter stage 12R, and counter stage 12S for the use-case example of 128 redundant word lines. However, it should be noted that the number of redundant word lines may be reduced by applying the additional circuitry 54 of FIG. 5A to the RWL address counter 74. The counter stage 12R is included external to each of the NWL address counter 72 and the RWL address counter 74.

As depicted, the NWL address counter 72 receives a modified clock signal based on the relationship between the incrementing signal (RefC_Up) and the inverted output of the counter stage 12R, while the RWL address counter 74 receives an inverted modified clock signal equal but opposite to the modified clock signal transmitted to the NWL address counter 72. As is described later with FIG. 6B, the signal 28B corresponding to the output from the counter stage 12R (e.g., CBR<14>) changes state in response to the falling edge of a signal transmitted from the NWL address counter 72 (e.g., CBRa<11>). The rising edge of the signal may initiate the redundant word line refreshing operations through communication with refreshing circuitry. Corresponding with the end of the redundant word line refreshing operations, a falling edge of a signal associated with the most significant bit of the address (e.g., CBRb<13>) may produce a one-shot pulse to reset the counter stage 12R. Once the counter stage 12R is reset to a low level, the NWL address counter 72 is enabled such that normal word line refreshing is resumed. These described operations may be repeated as much as is suitable for the embodiment. Since the counter stage 12R is controlled by a signal from the NWL address counter 72 (e.g., CBRa<11>), the refresh rate for the redundant word lines is four times the refresh rate for the normal word line. In this way, the redundant word line refresh rate may be changed by a multiplier different from four by using different outputs from the NWL address counter 72 to initiate refresh operations, such as the output from the counter stage 12M (e.g., times 2), counter stage 12K (times 8), or counter stage 12J (e.g., times 16), or the like.

Figure 6B:
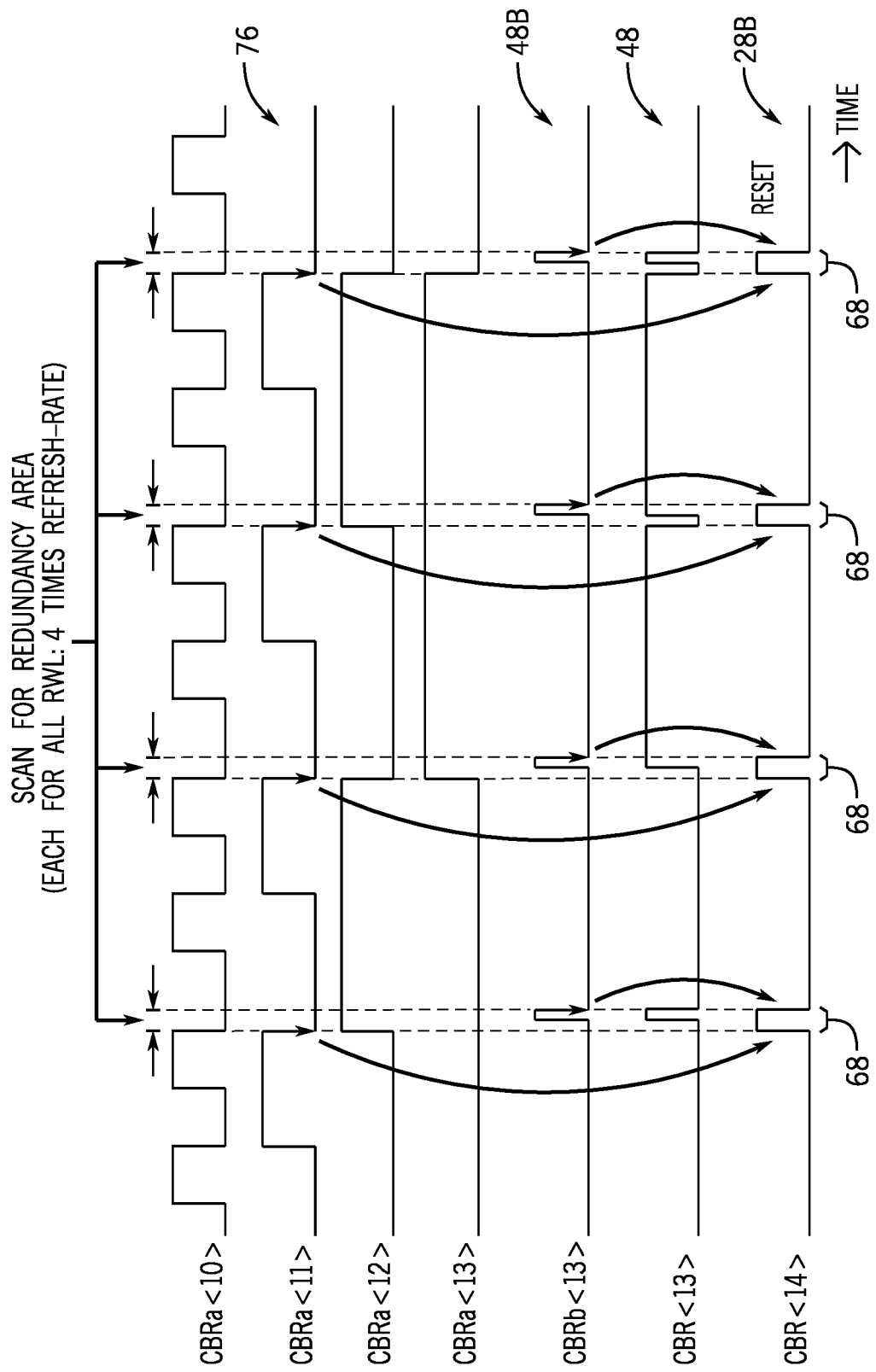
FIG. 6B is a timing diagram associated with operation of the address counter of FIG. 6A, in accordance with the fifth embodiment of this disclosure.

To help illustrate, FIG. 6B is a timing diagram associated with operation of the address counter 18E. The signal 28B corresponding to the output from the counter stage 12R (e.g., CBR<14>) changes state in response to the falling edge of a signal 76 from the NWL address counter 72 (e.g., CBRa<11>). The rising edge of the signal 28B initiates the redundant word line refreshing operations through communication with refreshing circuitry. A falling edge of a signal 48B associated with the most significant bit of the address (e.g., CBRb<13>) produces a one-shot pulse to reset the counter stage 12R, corresponding to the end of the redundant word line refreshing operations. Although not depicted, it should be understood that the redundant word line address is referenced during the redundant word line refreshing operations of duration 68 in response to the rising edge of the signal 28B. In this embodiment, the signal 76 (e.g., CBRa<11>) is used to initiate redundant word line refreshing operations, however, as noted above, it should be understood that any suitable output signal from the NWL address counter 72 may be used to initiate redundant word line refresh operations, where the selection of the output signal is based on the desired relationship between the refresh rates.

Figure 7A:
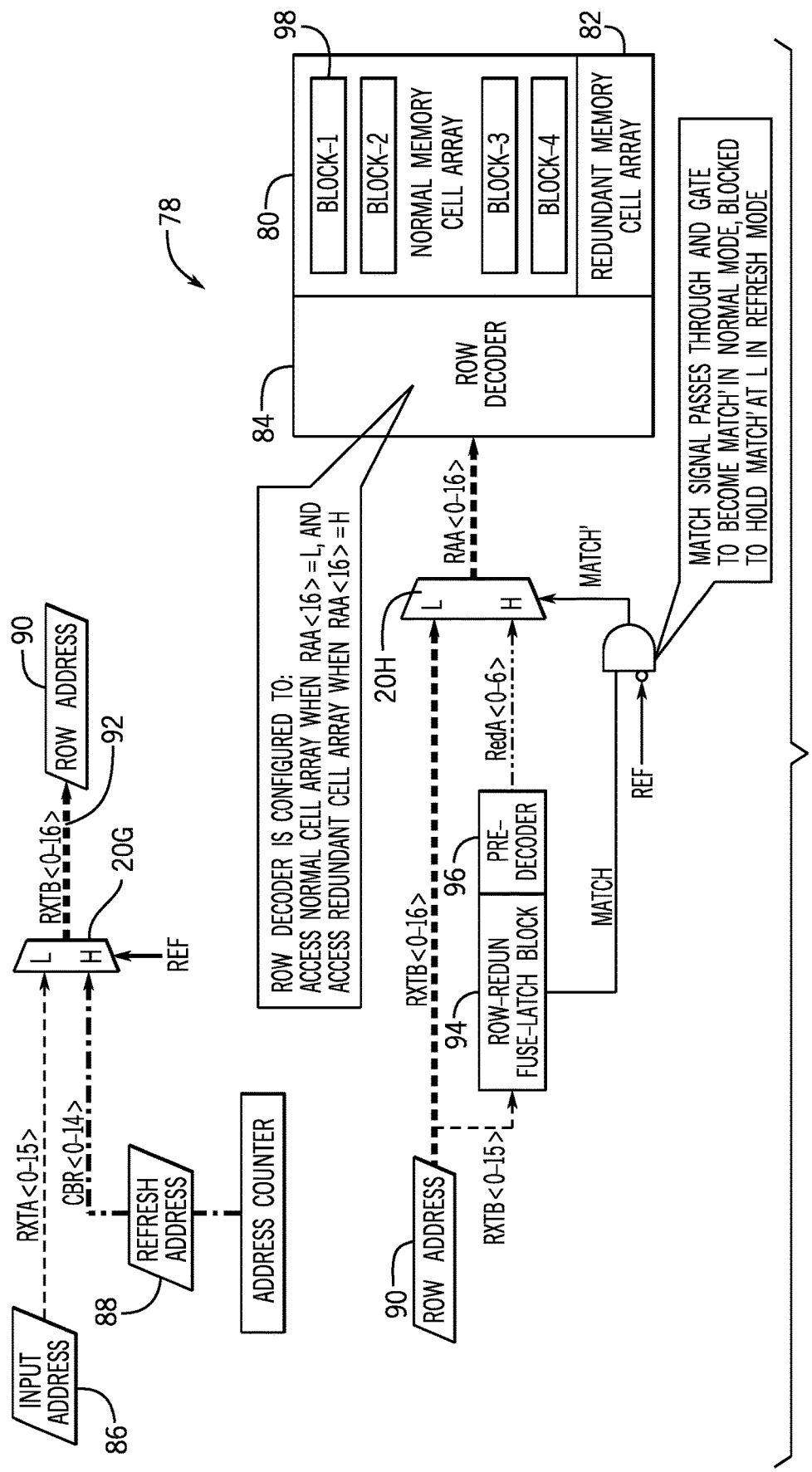
FIG. 7A is block diagram of a memory device including two memory arrays, a row decoder, a first multiplexer, and a second multiplexer, in accordance with an eighth embodiment of this disclosure.

An example embodiment using the above-described address counters 18 is depicted in FIG. 7A. FIG. 7A is block diagram of a memory device 78 including a normal memory cell array 80, a redundant memory cell array 82, a row decoder 84, a multiplexer 20G, and a multiplexer 20H. The multiplexer 20G (MUX1) receives an input address 86 (RXTA<0-15>) associated with a memory access row address provided from a device external to the memory device 78. This row address may be transmitted to the memory device 78 for use in memory operations, such as reading from or writing to the address associated with the input address 86. The multiplexer 20G also receives as a refresh address 88 the output (e.g., CBR<0-14>) from the address counter 18 discussed above, depicted as the "refresh address" though it should be understood that the row decoder 84 may translate the actual output from the address counter 18 or, ultimately, the output from the multiplexer 20H for use in addressing and/or refreshing operations. A refresh signal (Ref) may operate the multiplexer 20G to select the input address 86 when low and the refresh address 88 when high. During refresh operations, the Ref signal is at high. The multiplexer 20G outputs a row address 90 via a row address bus 92 in response to being operated to select a particular input.

The row address 90 transmits to the multiplexer 20H and to a row-redundancy fuse latch block (RR block) 94. The RR block 94 stores indications of defective row addresses, each of which designates a defective normal word line of the normal memory cell array 80 that is to be replaced with a redundant word line of the redundant memory cell array 82. The RR block 94 circuitry changes a Match signal to an active high level when the row address 90 matches a stored defective row address. The RR block 94 circuitry also produces a redundant word line address to be used to replace the defective normal word line with a redundant would line. In this way, when the row address 90 transmitted to the RR block 94 does not match a defective row address, an adjusted row address 90 from the RR block 94 is not permitted to transmit through the multiplexer 20H due to the state of the Match signal.

The RR block 94 includes a pre-decoder 96 that pre-decodes a redundant word line address produced to provide the adjusted row address (e.g., RedA<0-6>). In this way, the row address that is outputted to the row decoder 84 corresponds to where the data of the defective normal word line (e.g., originally indicated through the row address 90) is stored or is to be stored in the redundant memory cell array 82 (e.g., translated to the corresponding word line in the redundant memory cell array 82). The pre-decoded redundant row address is transmitted to the row decoder 84 in response to the Match' signal being a logical high. The logic level of Match' signal may be controlled by an AND gate receiving the Match signal and an inverted Ref signal. During the refresh operations, accordingly, the Match' signal is at low irrespective of the logic level of the Match signal, so that the multiplexer 20H may operate to select row address 90. During other operations than refresh (e.g., normal memory operation such as data read or write operations), the Match' signal may follow the Match signal in logic level.

The row decoder 84 accesses the normal memory cell array 80 and the redundant memory cell array 82. The normal memory cell array 80 includes four memory blocks (Block-1 to Block-4) 98 in this embodiment, however it should be understood that any suitable number of memory blocks may be used. Each memory block 98 of the normal memory cell array 80 includes 16,384 normal word lines when any of the address counter 18 embodiments are used (e.g., address counter 18B, address counter 18C, address counter 18D, or address counter 18E), while the redundant memory cell array includes 128 redundant word lines when the address counter 18B, 18C, and 18E are used or 96 redundant word lines when using the address counter 18D.

Each of the defective row addresses are optionally refreshed. In this way, the Match signal may indicate whether or not the row address 90 is defective. Accordingly, through usage of the Match signal, the memory device 78 may be programmed to perform no refresh operations on each of the defective row addresses despite how each row address 90 is generated by the address counter 18.

It is noted that various combinations of components of the memory device 78 may be considered arbitration circuitry to control transmission of the refresh address 88 corresponding to the redundant word lines to the row decoder 84 or the refresh address 88 corresponding to the normal word lines to the row decoder 84. For example, a combination of the multiplexers 20 included within the address counter 18, the multiplexer 20G, and the multiplexer 20H may be considered arbitration circuitry since through each individual operation of the components the transmission of the refresh address 88 is controlled.

To help explain operation of the memory device 78, FIG. 7B through FIG. 7E depict various outputs and operations of the memory device 78. For ease of explanation, the various outputs and operations of the memory device 78 are explained in terms of components and arrangements depicted in FIG. 7A, even though explicit reference back to FIG. 7A is omitted.

Figure 7B:
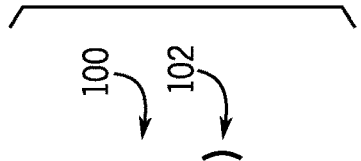
FIG. 7B is a table of an example output from the first multiplexer of FIG. 7A, in accordance with an embodiment of this disclosure.

FIG. 7B is a table of an example output from the multiplexer 20G. Row 100 corresponds to the output of the multiplexer 20G when the refresh signal (Ref) is low to indicate normal operations other than refresh and row 102 corresponds to the output when the refresh signal is high to indicate a refresh operation. The value of the refresh signal is changed to vary which row address to use, that is, whether to use the refresh address 88 generated using the address counter 18 or the input address 86 received from external circuitry. The row 100 includes sixteen bits corresponding to an input address 86 provided from a device external to the memory device 78 and a seventeenth bit (e.g., RXTB<16>) included as a low bit (e.g., 0). The row 102 includes fourteen bits (e.g., CBR<0-13>) corresponding to the refresh address 88 provided from the address counters 18 described above (e.g., address counter 18B, address counter 18C, address counter 18D, or address counter 18E). In addition to the refresh address 88, the row 102 also includes two empty bits (e.g., RXTA<14, 15>) and a seventeenth bit (e.g., CBR<14>) corresponding to the output from the counter stage 14R, responsible for controlling redundant word line refreshing operations. The output from the multiplexer 20G transmits as the row address 90 via the row address bus 92 as an input to the multiplexer 20H and as an input into the RR block 94.

Figure 7C:
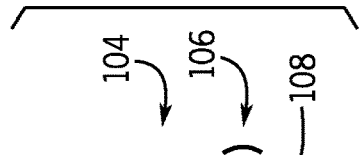
FIG. 7C is a table of an example output from the second multiplexer of FIG. 7A, in accordance with an embodiment of this disclosure.

To show the relationship of the row address that transmits from the multiplexer 20H to the row decoder 84 and the row address 90 transmitted via the row address bus 92, FIG. 7C is a table of an example output from the multiplexer 20H. Row 104 corresponds to the output of the multiplexer 20H when the Match' signal is low and row 106 corresponds to the output when the Match' signal is high. The state of the Match' signal may be the same state as the Match signal transmitted from the RR block 94. The row 104 includes seventeen bits corresponding to the row address transmitted as the output from the multiplexer 20G, meaning that the row 104 corresponds to either row 100 of FIG. 7B or to row 102 of FIG. 7B, represented now as a substitute input (e.g., RXTB<0-16>). The row 106 corresponds to an output from the RR block 94. Since the RR block 94 determines whether the row address 90 corresponds to a defective address, the seventeenth bit of the row 106 changes based on the relationship of the row address 90 to the stored defective addresses. In this way, a Match bit 108 is a high bit when the row address 90 matches a defective address, but is otherwise low. The remainder of row 106 illustrates the function of the pre-decoder 96 in preparing the row address to be used to reference the corresponding redundant word lines. As such, seven bits corresponding to a redundant word line address RedA<0-6> and nine bits not corresponding to that (e.g., RXTB<5-11, 14, 15>) may transmit from the multiplexer 20H, where the additional nine bits that do not correspond to the redundant word line address may be low bits or may be otherwise disregarded by the row decoder 84. The Match bit 108 is transmitted as the Match signal to the multiplexer 20H. Thus, the Match signal transmits through the depicted logic gate to become the Match' signal while accessing the normal word line but is blocked to hold the Match' signal low while accessing the redundant word line.

Figure 7D:
FIG. 7D is a table of outputs from the second multiplexer of FIG. 7A in response to several operational scenarios, in accordance with an embodiment of this disclosure.

To help illustrate the row address transmitted from the multiplexer 20H, FIG. 7D is a table of example outputs from the multiplexer 20H in response to four operational scenarios—that is, a normal access mode where the Match bit 108 is low, a normal access mode where the Match bit 108 is high, a refresh access mode where the output from the counter stage 12R is low, and a refresh access mode where the output from the counter stage 12R is high. Row 110 corresponds to the normal access mode where the Match bit 108 is low and is generated in response to the RR block 94 determining that the row address 90 does not match a stored defective address. Since the Match bit 108 is low, the multiplexer 20H operates to output according to the previous row 104, meaning that the output of the multiplexer 20H depends on the row address 90. In the first operational scenario, the output of the multiplexer 20H corresponds to the row 110 since a memory operation is being performed according to an input address 86 that is not defective.

The row 106 corresponds to the normal access mode where the Match bit 108 is high and is generated in response to the RR block 94 determining that the row address 90 matches a stored defective address. In this situation, the multiplexer 20H receives the Match bit 108 and operates to output data of the row 106 to the row decoder 84. In the second operation scenario, the output of the multiplexer 20H corresponds to a redundant word line that is replacing the defective normal word line originally indicated through the row address 90.

Row 112 corresponds to a refresh access mode where the output (e.g., CBR<14>) from the counter stage 12R is low, therefore indicating normal word line refreshing, and row 114 corresponds to the refresh access mode where the output (e.g., CBR<14>) from the counter stage 12R is high, therefore indicating redundant word line refreshing. As a reminder, during operation of the address counter 18, various bits of the address used in the refresh operations are held at low to negate the influence in the final address of those bits. In this way, certain bits (e.g., CBR<5-11>) of the row 114 are equal to zero. Upon receiving either the row 112 or the row 114, the row decoder 84 references the various bits associated with the particular refreshing operation and performs the refreshing.

To help illustrate row decoder 84 operation, FIG. 7E is a table depicting operations of the row decoder 84 in response to the four operational scenarios discussed in FIG. 7D—that is, a first operational mode corresponding to a normal access mode where the Match bit 108 is low, a second operational mode corresponding to a normal access mode where the Match bit 108 is high, a third operational mode corresponding to a refresh access mode where the output (e.g., CBR<14>) from the counter stage 12R is low, and a fourth operational mode corresponding to a refresh access mode where the output (e.g., CBR<14>) from the counter stage 12R is high.

The first operational mode causes the row decoder 84 to access the normal memory cell array 80 in response to an input address 86 received from an external device (e.g., RXTA<0-15>) transmitted to the row decoder 84 as an input (e.g., RAA<0-16>) from the multiplexer 20H. The second operational mode causes the row decoder 84 to access the redundant memory cell array 82 in response to a redundant row address transmitted to the row decoder 84 as an input (RAA<0-4, 12, 13>=RedA<0-6>) from the multiplexer 20H to replace the defective normal word line with a redundant word line to perform the memory operation.

The third operational mode causes the row decoder 84 to refresh respective normal word lines of memory blocks 98 of the normal memory cell array 80 simultaneously in response to the row address (RAA<0-13>=CBR<0-13>) transmitted from the multiplexer 20H. In this way, one counting operation facilitates the refreshing of four normal memory blocks 98 since each includes the same number of normal word lines.

The fourth operational mode causes the row decoder 84 to refresh individual redundant word lines of the redundant memory cell array 82 in response to the received address from the multiplexer 20H. In some embodiments, the refresh rate of the redundant memory cell array 82 is double the refresh rate of the normal memory cell array 80 but may be varied based on the address counter 18 embodiment used in the memory device 78, as discussed earlier. These various operational modes may result based, in part, on bits within the various address instructing and/or guiding the row decoder 84 on which operation to perform.

Figure 8A:
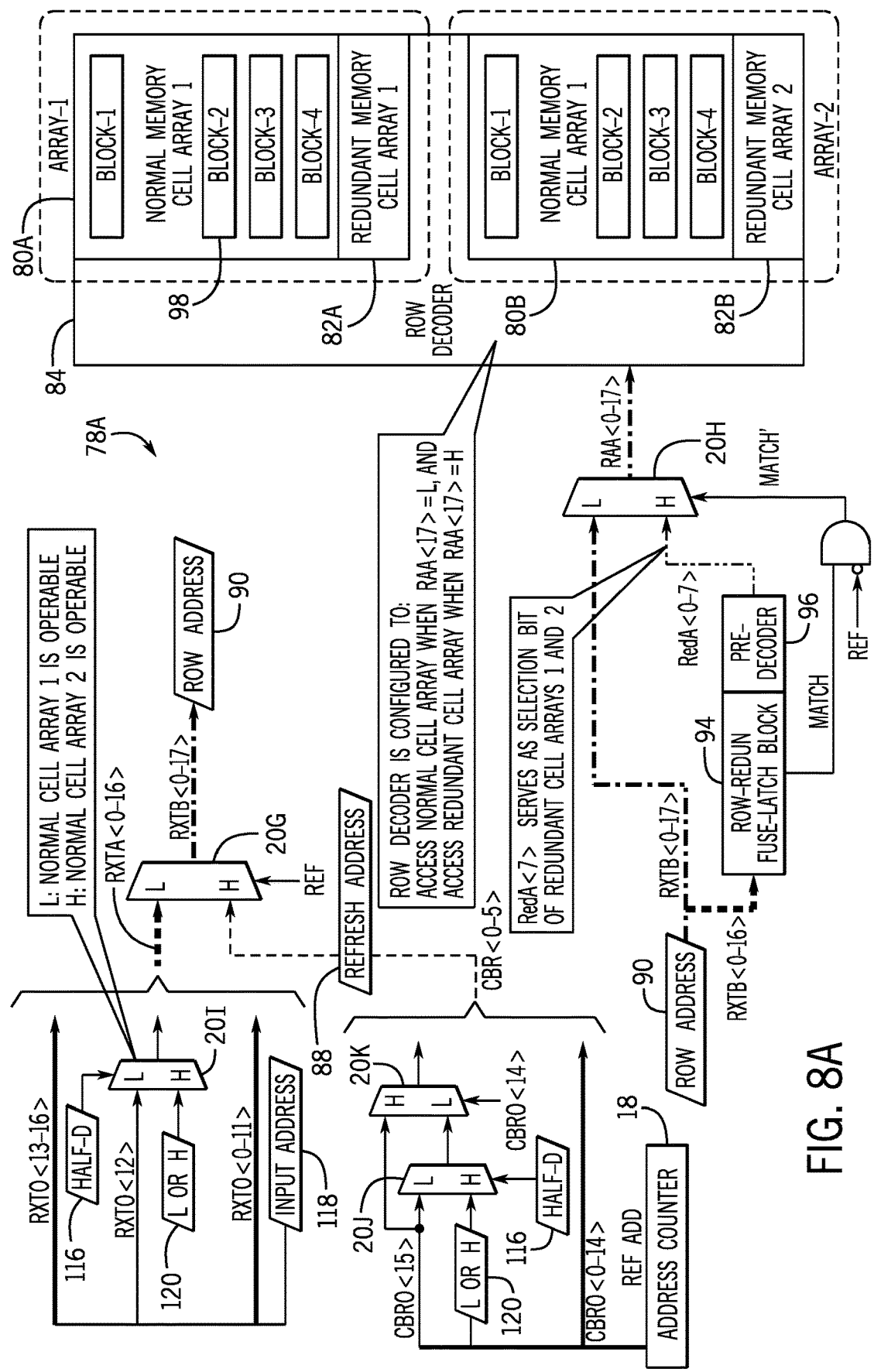
FIG. 8A is a block diagram of a memory device that is capable of being operated in a full-product memory operational mode and a half-product memory operational mode, in accordance with a ninth embodiment of this disclosure.

FIG. 8A is a block diagram of an embodiment of the memory device 78A including a normal memory cell array 80A, a normal memory cell array 80B, a redundant memory cell array 82A, a redundant memory cell array 82B, the row decoder 84, the multiplexer 20G, and the multiplexer 20H. As seen in FIG. 7A, if both the normal memory cell array 80A and the normal memory cell array 80B are operable, the memory device 78 is shipped as a complete product. Sometimes, however, one or both of the normal memory cell arrays 80 include too many defective normal word lines and in this way, the number of the defective normal word lines exceeds a number of redundant word lines. When this situation arises, the memory device 78A may be shipped as a half-product having total memory capacity reduced to half the capacity of a full-product. In this case, it may be desirable to use the redundant memory cell array 82 that is associated with the inoperable normal memory cell array 80 for the operable normal memory cell array 80 in addition to the redundant memory cell array 82 already corresponding to the operable normal memory cell array 80. This embodiment indicates two such cases shipping as a full-product (e.g., as depicted in FIG. 8B to 8G) and as a half-product (FIG. 8H to 8M) through use of a control signal (Half-D) 116 and the address counters 18 discussed so far. When the control signal 116 is low, the memory device 78A is operated as a full-product, while when the control signal 116 is high, the memory device 78A is operated as a half-product.

Additional settings may be used to further configure the memory device 78 to operate as a full-product or half-product. For example, an input 120 (e.g., L or H) to a multiplexer 20I indicates whether the normal memory cell array 80A or normal memory cell array 80B is operable. The multiplexer 20I may change the thirteenth bit (e.g., RXTA<12>) of an input address 118 (e.g., RXTA<0-16>) received from external circuitry based on the state of the control signal 116. The other bits of the input address 118 (e.g., RXTA<0-11, 13-16>) remain generally unchanged in response to the control signal 116. The input address 118 may be selected through the selection signal (Ref) based on whether memory operations or refreshing operations are to be performed.

The refresh address 88 (e.g., CBR0<0-15>) generated by the address counter 18 also may change in response to the control signal 116. The control signal 116 may operate a multiplexer 20J select between an unchanged sixteenth bit (e.g., CBR0<15>) of the refresh address 88 or the input 120. In response to the control signal 116 being a high signal, the input 120 transmits as the sixteenth bit to a multiplexer 20K. However, in response to the control signal being a low signal, the multiplexer 20J may transmit the original sixteenth bit (e.g., CBR0<15>) to the multiplexer 20K. The multiplexer 20K may be operated based on the value of the fifteenth bit (e.g., CBR<14>) transmitted from the counter stage 12R, and therefore may change state based at least in part on which refreshing mode (e.g., normal vs redundant refreshing mode) the memory device 78 is to be operated in. Based on the combination of signals transmitted to the multiplexer 20K and the multiplexer 20J, a sixteenth bit transmits along with the first fifteen bits form the address counter 18 to the multiplexer 20G. As described above, the multiplexer 20G transmits an input based on the refresh signal (Ref) as the row address 90 via the row address bus 92.

The multiplexer 20H receives the row address 90 and is operated in a similar way as previously described in the memory device 78. The state of a last bit (e.g., RAA<16>) may be used as a selection bit to select one of the redundant memory cell arrays 82 to be used in refreshing operations or in memory operations.

It is noted that various combinations of components of the memory device 78A may be considered arbitration circuitry to control transmission of the refresh address 88 corresponding to the redundant word lines to the row decoder 84 or the refresh address 88 corresponding to the normal word lines to the row decoder 84. For example, a combination of the multiplexers 20 included within the address counter 18, the multiplexer 20G, and the multiplexer 20H may be considered arbitration circuitry since through each individual operation of the components the transmission of the refresh address 88 is controlled.

To help explain full-product operation of the memory device 78A, FIG. 8B is a table of an example address shown in row 122, specifically the input address 86 (e.g., RXTA<0-16>), transmitted to the multiplexer 20G during the full-product memory operational mode. While in the full-product mode, the control signal 116 is a low signal, meaning the multiplexer 20G is operated to output an original thirteenth bit (e.g., RXT0<12>) as the thirteenth bit in the input (RXTA<0-16>) to the multiplexer 20G. This is in contrast to the input 120 (e.g., L or H) that is transmitted as the thirteenth bit when the control signal 116 is operated as a high signal while in the half-product mode.

FIG. 8C is a table of a second example address depicted in row 124, specifically the refresh address 88 transmitted to the multiplexer 20G during the full-product memory operational mode. In this example, the control signal 116 is low, thus the sixteenth bit of the refresh address 88 is the originally transmitted bit (e.g., CBR0<15>) from the counter stage 12S. The multiplexer 20K may normally be operated based on the value of the fifteenth bit (e.g., CBR0<14>) transmitted from the counter stage 12R, however, in this example, the actual value of the fifteenth bit does not matter since the originally transmitted bit (e.g., CBR0<15>) from the counter stage 12S is transmitted along with the other bits to generate the refresh address 88 to the multiplexer 20G.

FIG. 8D is a table of the two possible outputs from the multiplexer 20G during the full-product memory operational mode. As depicted, a row 126 includes eighteen bits that correspond sequentially to an address received from external circuitry in addition to an eighteenth bit appended to the address indicative of a low bit. The row 126 may transmit as a row address 90 output via the row address bus 92 from the multiplexer 20G in response to a low refresh signal (Ref). In addition, a row 128 includes twelve bits sequentially corresponding to the original bits transmitted from the address counter 18 (e.g., CBR<0-11>), and includes several bits not in complete sequential order (e.g., CBR<15, 12, 13, 14>), and several appended bits from the address received from the external circuitry (e.g., RXTA<15, 16>). A bit corresponding to the output from the counter stage 12R (e.g., CBR<14>) is included in the eighteenth bit position of the row 128 because the bit may later be used to command the row decoder 84 to access the normal memory cell array 80 or the redundant memory cell array 82. Furthermore, the bit of the row 128 (e.g., CBR<15>) corresponding to the thirteenth bit positions (e.g., RXTB<12>) may later be used as a selection bit to select either the redundant memory cell array 82A or the redundant memory cell array 82B.

In addition, FIG. 8E is a table of possible outputs from the multiplexer 20H during the full-product memory operational mode. The Match' signal selects the output of the multiplexer 20H based on whether the signal is high or low. If the Match' signal is low, the row address 90 is transmitted as the output from the multiplexer 20H without alteration. In this way, row 130 corresponds to the row address transmitted with the Match' signal is low. However, when the Match' signal is high, the multiplexer 20H transmits the output from the RR block 94 and the pre-decoder 96 to the row decoder 84. Row 132 corresponds to an example output from the RR block 94 and the pre-decoder 96 transmitted as the output (e.g., RAA<0-17>) from the multiplexer 20H. As discussed earlier, the thirteenth bit (e.g., RAA<12>=RedA<7>) may be used to command the row decoder 84 to select the redundant memory cell array 82A or the redundant memory cell array 82B for use in memory operations and/or refresh operations. Additionally, the eighteenth bit (e.g., RAA<17>) may be used as the Match signal transmitted to control the multiplexer 20H.

To help illustrate the address transmitted from the multiplexer 20H, FIG. 8F is a table of example outputs from the multiplexer 20H in response to four operational scenarios—that is, a normal access mode where the Match bit 108 is low, a normal access mode where the Match bit 108 is high, a refresh access mode where the output (e.g., CBR<14>) from the counter stage 12R is low, and a refresh access mode where the output (e.g., CBR<14>) from the counter stage 12R is high. Row 134 corresponds to the normal access mode where the Match bit 108 is low and is generated in response to the RR block 94 determining that the row address 90 does not match a stored defective address. The row 132 corresponds to the normal access mode where the Match bit 108 is high and is generated in response to the RR block 94 determining that the row address 90 does match a stored defective address. In this situation, the multiplexer 20H receives the Match bit 108 and operates to output data of the row 132 to the row decoder 84. A row 136 corresponds to a refresh access mode where the output (e.g., CBR<14>) from the counter stage 12R is low and a row 138 corresponds to the refresh access mode where the output (e.g., CBR<14>) from the counter stage 12R is high. As a reminder, when the output (e.g., CBR<14>) from the counter stage 12R is low, the row decoder 84 (e.g., refresh circuitry) may operate to refresh normal word lines while when the output (e.g., CBR<14>) from the counter stage 12R is high, the row decoder 84 operates to refresh redundant word lines. Upon receiving either the row 136 or the row 138, the row decoder 84 references the various bits associated with the particular refreshing operation and performs the refreshing. The table of FIG. 8F is similar to the table of FIG. 7D except that several additional bits have been appended to the row 134, the row 132, the row 136, and the row 138 to enable operational of the memory device 78A. For example, an array select bit is included (e.g., RXT0<12>) to facilitate the selection of the normal memory cell arrays 80 and redundant memory cell arrays 82.

To help illustrate row decoder 84 operation, FIG. 8G is a table depicting operations of the row decoder 84 in response to the operational scenarios discussed in FIG. 8F—that is, a first operational mode corresponding to a normal access mode where the Match bit 108 is low, a second operational mode corresponding to a normal access mode where the Match bit 108 is high, a third operational mode corresponding to a refresh access mode where the output (e.g., CBR<14>) from the counter stage 12R is low and normal word lines are refreshed, and a fourth operational mode corresponding to a refresh access mode where the output (e.g., CBR<14>) from the counter stage 12R is high and the redundant word lines are refreshed.

The first operational mode causes the row decoder 84 to select one of the normal memory cell arrays 80 in response to the state of the thirteenth bit (e.g., RAA<12>=RedA<7>) transmitted from the multiplexer 20H. After selecting one of the normal memory cell arrays 80, the row decoder 84 accesses the selected normal memory cell array 80 in response to the address communicated via the remaining bits (e.g., RAA<0-11, 13-16>=RedA<0-6>).

The second operational mode causes the row decoder 84 to select one of the redundant memory cell arrays 82 in response to the thirteenth bit (e.g., RAA<12>=RedA<7>). After selecting a redundant memory cell array 82, the row decoder 84 operates to access the selected redundant memory cell array 82 in response to the address communicated via the remaining bits (e.g., RAA<0-4, 13, 14>=RedA<0-6>).

While the memory device 78A is in the third operational mode, the row decoder 84 refreshes a respective normal word line within each of the normal memory cell arrays 80 simultaneously responsive to the address transmitted from the multiplexer 20H (e.g., RAA<0-11, 13, 14>=CBR<0-13>). The row decoder 84 may ignore the data transmitted as the thirteenth bit (e.g., RAA<12>=CBR<15>) and the data transmitted as the sixteenth and seventeenth bits (e.g., RAA<15, 16>=RXT0<15, 16>).

In addition, while the memory device 78A operates in the fourth operational mode, the row decoder 84 refreshes redundant memory cell arrays 82 simultaneously in response to the address transmitted from the multiplexer 20H (e.g., RAA<0-4, 13, 14>=CBR<0-4, 12, 13>). In some embodiments, the refresh rate for each of the redundant memory cell arrays 82 is double the refresh rate of the normal memory cell arrays 80 but may be varied based on the address counter 18 used in the memory device 78, as discussed earlier. These various operational modes may result in part based on bits within the various address instructing and/or guiding the row decoder 84 on which operation to perform.

The following descriptions correspond to example outputs associated with the memory device 78A being operated in a half-product memory operational mode. While in the half-product mode, the memory device 78A receives the control signal 116 that is high. This control signal 116 operates the multiplexer 20G and the multiplexer 20J to select an input that varies based on which normal memory cell array 80 is operable (e.g., normal memory cell array 80A or normal memory cell array 80B). As a reminder, during the half-product memory operational mode, the above-discussed features are generally leveraged to permit continued use of a memory device 78 even if the number of defective normal word lines exceeds the number of redundant word lines.

To help explain half-product operation of the memory device 78A, FIG. 8H is a table of an example address corresponding to row 140, specifically the input address 118 (e.g., RXTA<0-16>) to the multiplexer 20G received by the memory device 78A during the half-product memory operational mode. While in the half-product mode, the control signal 116 is a high signal, meaning the multiplexer 20I is operated to output either a low signal or a high signal as the thirteenth bit of the input (e.g., RXTA<0-16>) to the multiplexer 20G. An input 120 (e.g., L or H) is determined and/or set based on which normal memory cell array 80 is operable, for example, the input 120 may be low if the normal memory cell array 80A is operable or high if the normal memory cell array 80B is operable.

FIG. 8I is a table of a second example address corresponding to row 142, specifically refresh address 88 (e.g., CBR<0-15>) to the multiplexer 20G, used by the memory device 78A during the half-product memory operational mode. In this example, the control signal 116 is high, thus the sixteenth bit of the other input (CBR<0-15>) to the multiplexer 20G is the input 120. The multiplexer 20K may be operated based on the value of the fifteenth bit (e.g., CBR<14>) transmitted from the counter stage 12R. Thus, in response to the value of the fifteenth bit, the multiplexer 20K may be operated to transmit as the sixteenth (e.g., last) bit of the refresh address 88 either the input 120 or the originally transmitted sixteenth bit (e.g., CBR0<15>).

FIG. 8J is a table of the two possible outputs from the multiplexer 20G during the half-product memory operational mode. As depicted, a row 144 includes eighteen bits that correspond sequentially to an address received from external circuitry in addition to an eighteenth bit appended to the address indicative of a low bit. The row 144 may transmit as a row address 90 via the row address bus 92 from the multiplexer 20G in response to a low refresh signal (Ref). In addition, a row 146 includes twelve bits sequentially corresponding to the original transmitted bits from the address counter 18 (e.g., CBR<0-11>), and includes several bits not in complete sequential order (CBR<15, 12, 13, 14>), and several appended bits from the address received from the external circuitry (RXTA<15, 16>). A bit corresponding to the output from the counter stage 12R (e.g., CBR<14>) is included in the eighteenth bit position of the row 146. This bit may later be used to command the row decoder 84 to access the normal memory cell array 80 or the redundant memory cell array 82. Furthermore, the bit of the row 146 (e.g., CBR<15>) corresponding to the thirteenth bit position (e.g., RXTB<12>) may later be used as a selection bit to select either the redundant memory cell array 82A or the redundant memory cell array 82B during replacement operations. The row 144 and the row 146 are the same as the previously depicted row 126 and row 128.

In addition, FIG. 8K is a table of possible outputs from the multiplexer 20H during the half-product memory operational mode. If the Match' signal is low, the row address 90 is transmitted as the output from the multiplexer 20H without alteration. In this way, row 148 corresponds to the row address 90 transmitted where the Match' signal is low and is the same as the previously depicted row 130 in FIG. 8E. However, when the Match' signal is high, the multiplexer 20H transmits the output from the RR block 94 and the pre-decoder 96 to the row decoder 84, where the output corresponds to row 150. The row 150 is also the same as previously depicted row 132.

To help illustrate the row address transmitted from the multiplexer 20H, FIG. 8L is a table of example outputs from the multiplexer 20H in response to four operational scenarios—that is, a normal access mode where the Match bit 108 is low, a normal access mode where the Match bit 108 is high, a refresh access mode where the output (e.g., CBR<14>) from the counter stage 12R is low, and a refresh access mode where the output (e.g., CBR<14>) from the counter stage 12R is high. Row 152 corresponds to the normal access mode where the Match bit 108 is low and is generated in response to the RR block 94 determining that the row address 90 does not match a stored defective address. The row 152 is similar to the row 134 of FIG. 8F except that the thirteenth bit (e.g., RAA<12>) is the input 120 (e.g., L or H). As indicated in the table, the input 120 is a fixed value based on which normal memory cell array 80 is operable.

The row 150 corresponds to the normal access mode where the Match bit 108 is high and is generated in response to the RR block 94 determining that the row address 90 does match a stored defective address. In this situation, the multiplexer 20H receives the Match bit 108 and operates to output data of the row 150 to the row decoder 84. The row 150 and the row 132 are similar except that the sixteenth and seventeenth bits (e.g., RAA<15, 16>) are included in transmission and may be transmitted as low voltage signals.

Row 154 corresponds to a refresh access mode where the output from the counter stage 12R is low (e.g., CBR<14>=L). As a reminder, when the output from the counter stage 12R is low, the row decoder 84 (e.g., refresh circuitry) operates to refresh normal word lines. The row 136 corresponds to the row 154 except that the thirteenth bit (e.g., RAA<12>) is the configurable setting (e.g., L or H). In addition, row 156 corresponding to the refresh access mode that occurs while the selection signal is high, causing the Match' signal to be held low. The row 156 corresponds to the output from the multiplexer 20J when the output from the counter stage 12R is high (e.g., CBR<14>=H). Upon receiving either the row 154 or the row 156, the row decoder 84 references the various bits associated with the particular refreshing operation and performs the refreshing accordingly.

To help illustrate row decoder 84 operation, FIG. 8M is a table depicting operations of the row decoder 84 in response to the operational scenarios discussed in FIG. 8L—that is, a first operational mode corresponding to a normal access mode where the Match bit 108 is low, a second operational mode corresponding to a normal access mode where the Match bit 108 is high, a third operational mode corresponding to a refresh access mode where the output (e.g., CBR<14>) from the counter stage 12R is low and normal word lines are refreshed, and a fourth operational mode corresponding to a refresh access mode where the output (e.g., CBR<14>) from the counter stage 12R is high and the redundant word lines are refreshed.

While the memory device 78A is operating in the first operational mode, the row decoder 84 selects one of the normal memory cell arrays 80 as designated by the thirteenth bit (e.g., RAA<12>), which corresponds to the input 120 (e.g., L or H). After selecting one of the normal memory cell arrays 80, the row decoder 84 may access the normal word lines according to the address indicated by a portion (e.g., RAA<0-11, 13-16>=RXT0<0-11, 12-15>) of the row address (e.g., RAA<0-17>=RXT0<0-16> and RXTB<17>) transmitted from the multiplexer 20H.

While the memory device 78A is operating in the second operational mode, the row decoder 84 selects one of the redundant memory cell arrays 82 as designated by the thirteenth bit (e.g., RAA<12>=RedA<7>). After selecting either the redundant memory cell array 82A or the redundant memory cell array 82B, the row decoder 84 may access the redundant word line of redundant memory cell array 82 according to the address indicated by a portion (e.g., RAA<0-4, 13, 14>=RedA<0-4, 5, 6>) to perform the requested memory operation with the corresponding redundant word line instead of the originally addressed defective normal word line.

While the memory device 78A operates in the third operational mode, the row decoder 84 may select which one of the normal memory cell arrays 80 is operable as designated by the thirteenth bit (RAA<12>), which corresponds to the input 120 (e.g., L or H). After selecting the operable normal memory cell array 80, the row decoder 84 refreshes a respective normal word line in each memory block 98 of the normal memory cell array 80 at the same time. In this way, one addressing operation causes the simultaneous refresh of all instances of that address across the normal memory cell array 80 that is operable. For example, if the normal memory cell array 80A is operable, each memory block of the normal memory cell array 80A refreshes the same addressed normal word line. A first portion (e.g., RAA<0-11, 13, 14>=CBR<0-11, 12, 13>) of the row address transmitted to the row decoder 84 is used to address the normal word line to be refreshed while a second portion (RAA<15, 16>=RXT0<14, 15>) of the row address may be ignored.

In addition, while the memory device 78A operates in the fourth operational mode, the row decoder 84 may select one of the redundant memory cell arrays 82 as designated by the thirteenth bit (e.g., RAA<12>=CBR<15>). The row decoder 84 may refresh a particular addressed redundant word line within the selected redundant memory cell array 82. The addressed redundant word line is indicated through a first portion (e.g., RAA<0-4, 13, 14>=CBR<0-4, 12, 13>) of the row address transmitted from the multiplexer 20H while a second portion (e.g., RAA<5-11, 15, 16>=CBR<5-11>, RXT0<14, 15>) of the row address may be ignored. In some embodiments, the refresh rate for each of the redundant memory cell arrays 82 is double the refresh rate of the normal memory cell arrays 80 but may be varied based on the address counter 18 used in the memory device 78, as discussed earlier. These various operational modes may result based, at least in part, on bits within the various address instructing and/or guiding the row decoder 84 on which operation to perform.

It should be noted that, although described above as including two normal memory cell arrays 80 and two redundant memory cell arrays 82, the memory device 78 may include any suitable number of normal memory cell arrays 80 and/or redundant memory cell arrays 82. In response to any changes in number of memory cell arrays, suitable scaling of components is to be incorporated such that addressing operations and refreshing operations may continue to be compatible.

Thus, the technical effects of the present disclosure include improvements to address counters of memory devices to permit the simultaneous counting of addresses for normal word lines and redundant word lines. These techniques also describe modified addressing and memory devices that permit correction of defective memory having a number of defective normal word lines that exceeds a number of redundant word lines, for example, through using modified addressing operations to instruct a row decoder to selectively refresh and reference particular portions of normal and redundant memory cell arrays in response to settings and/or status bits appended along with addresses.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus comprising:
   a plurality of flip-flops; and
   at least one multiplexer coupled between an input of a first flip-flop and an output of a second flip-flop, wherein the plurality of flip-flops and the at least one multiplexer are configured to provide a single address counter, wherein respective outputs from each of the plurality of flip-flops are configured to indicate first address information, wherein respective outputs from a subset of the plurality of flip-flops are configured to indicate second address information, wherein the first address information comprises a first number of bits, wherein the second address information comprises a second number of bits is smaller than the first number of bits, wherein the single address counter is further configured to, in response to an incrementing signal:
   perform a first updating operation a first plurality of times, the first updating operation changing the first address information at least in part by changing a first count indicated by the first number of bits from a first initial value to a first final value; and
   perform a second updating operation a second plurality of times, the second updating operation changing the second address information at least in part by changing a second count indicated by the second number of bits from a second initial value to a second final value, wherein the second updating operation is performed at least twice per the first updating operation being performed once.

2. The apparatus of claim 1, wherein the first initial value is the same as the second initial value and the first final value is different from the second final value.

3. The apparatus of claim 1, wherein the first updating operation is divided into at least first and second partial updating operations.

4. The apparatus of claim 1, comprising:
   a normal memory cell array comprising a plurality of normal rows; and
   a redundant memory cell array comprising a plurality of redundant rows, wherein the first address information is configured to be updated to designate the plurality of normal rows, respectively, and the second address information is configured to be updated to designate the plurality of redundant rows, respectively, so that a refresh rate of the redundant memory cell array is greater than a refresh rate of the normal memory cell array.

5. The apparatus of claim 1, comprising:
   a normal memory cell array comprising a plurality of normal rows;
   a first redundant memory cell array comprising a plurality of first redundant rows; and
   a second redundant memory cell array comprising a plurality of second redundant rows,
   wherein the first address information is configured to be updated to designate the plurality of normal rows, respectively,
   wherein the second address information is configured to be updated to designate the plurality of first redundant rows, respectively, by firstly performing the second updating operation, and
   wherein the second address information is configured to be updated to designate the plurality of second redundant rows, respectively, by secondary performing the second updating operation.

6. The apparatus of claim 1, comprising an additional plurality of flip-flops, wherein the single address counter is configured to receive a system logic low voltage at a first flip-flop of the additional plurality of flip-flops during the second updating operation.

7. The apparatus of claim 1, wherein the second final value is configured based at least in part on a refresh rate associated with the second updating operation.

8. A method, comprising:
   performing a first updating operation a first plurality of times configured to update a first address information, the first updating operation being such that the first address information corresponds to an indication of a first count that updated from a first initial value to a first final value in response to an incrementing signal;
performing a second updating operation a second plurality of times configured to update a second address information, the second updating operation being such that the second address information corresponds to an indication of a second count updated from a second initial value to a second final value in response to the incrementing signal; and
performing the second updating operation at least twice per the first updating operation being performed once, wherein the first updating operation and the second updating operation are configured to update a single address counter comprising a plurality of flip-flops configured to maintain the indication of the first count and a subset of the plurality of flip-flops configured to maintain the indication of the second count.

9. The method of claim 8, wherein the first initial value is the same as the second initial value and the first final value is greater than the second final value.

10. The method of claim 8, wherein the first updating operation is divided into a plurality of partial updating operations.

11. The method of claim 8, comprising:
updating the first address information comprising an indication of a plurality of normal word lines; and
updating the second address information comprising an indication of a plurality of redundant word lines, wherein a refresh rate associated with the plurality of redundant word lines is greater than a refresh rate associated with the plurality of normal word lines.

12. The method of claim 8, comprising:
updating the first address information comprising an indication of a plurality of normal word lines based at least in part on firstly performing the first updating operation; and
updating the second address information comprising an indication of a plurality of redundant word lines based at least in part on secondarily performing the second updating operation, wherein a refresh rate associated with the plurality of redundant word lines is greater than a refresh rate associated with the plurality of normal word lines.

13. The method of claim 8, comprising:
updating, at a first refresh rate, the first address information configured to be presented by respective logical states of a plurality of flip-flops; and
updating, at a second refresh rate greater than twice the first refresh rate, the second address information associated with redundant word lines of a redundant memory cell array.

14. The method of claim 8, wherein the second final value is configured based at least in part on a refresh rate associated with the second updating operation.

15. A memory device, comprising:
an address counter configured to increment a first count at a first refresh rate and a second count at a second refresh rate, wherein the address counter comprises an indication of the first count and of the second count, wherein the incrementing occurs until the first count reaches a first maximum value, and wherein the second count is based at least in part on the second refresh rate;
a row decoder configured to perform refresh operations based at least in part on the first count and on the second count; and
arbitration circuitry configured to control transmission of the second count to the row decoder.

16. The memory device of claim 15, wherein the address counter comprises flip-flop circuitry configured to maintain and increment the first count and the second count in response to an input signal.

17. The memory device of claim 16, wherein the second refresh rate is based at least in part on interconnections between the flip-flop circuitry of the address counter.

18. The memory device of claim 15, wherein the row decoder is configured to perform memory operations in response to receiving an indication of an address, wherein the arbitration circuitry is configured to stop transmission of the second count and the first count to the row decoder, and wherein the arbitration circuitry is configured to permit transmission of the address to the row decoder.

19. The memory device of claim 15, wherein the address counter comprises counting circuitry, wherein the address counter maintains the first count with the counting circuitry, and wherein the address counter maintains the second count with a subset of the counting circuitry.

20. The apparatus of claim 1, wherein the at least one multiplexer comprises a first multiplexer and a second multiplexer, wherein the plurality of flip-flops comprises the subset of the plurality of flip-flops and an additional subset of the plurality of flip-flops, wherein the subset of the plurality of flip-flops being divided into a first group of flip-flops and a second group of flip-flops, wherein the first group of flip-flops comprises the second flip-flop and electrically couples to the first multiplexer at an output from the second flip-flop, wherein the additional subset of the plurality of flip-flops electrically couples to an output from the first multiplexer at an input to the first flip-flop, wherein the additional subset of the plurality of flip-flops electrically is configured to couple electrically to the second group of flip-flops via the second multiplexer, wherein the incrementing signal is received at the first group of flip-flops and clocked through one or more of the plurality of flip-flops based on respective states of the first multiplexer, or the second multiplexer, or both, wherein a changing of the respective states of the first multiplexer, or the second multiplexer, or both, is driven by transitions of the incrementing signal.

* * * * *

UNITED STATES PATENT AND TRADEMARK OFFICE
CERTIFICATE OF CORRECTION

PATENT NO. : 10,839,868 B2  
APPLICATION NO. : 16/521124  
DATED : November 17, 2020  
INVENTOR(S) : Yuan He and Yutaka Ito Page 1 of 1

It is certified that error appears in the above-identified patent and that said Letters Patent is hereby corrected as shown below:

In the Drawings

FIG. 7E, sheet 14 of 23, please delete "RAA<14, 15> (=RXT<14, 15>): DON'T CARE)" and insert --(RAA<14, 15> (=RXT<14, 15>): DON'T CARE)--, therefor.

FIG. 8G, sheet 19 of 23, please delete "(=RXTO<0-11, 13,-16>)" and insert --(=RXTO<0-11, 13-16>)--, therefor.

In the Specification

In Column 15, Line 47, please delete "first fifteen bits form the address" and insert --first fifteen bits from the address--, therefor.

In Column 7, Line 48, please delete "of the counter stage N" and insert --of the counter stage 12N--, therefor.

Signed and Sealed this  
Twenty-second Day of December, 2020

Andrei Iancu  
*Director of the United States Patent and Trademark Office*